340-3E5 2 AU 264 FY
1/21/86 VS SE 32,069

United States Patent [19]

Tomisawa

[11] E Patent Number: Re. 32,069

[45] Reissued Date of Patent: Jan. 21, 1986

[54] DEVICE FOR DETECTING A KEY SWITCH OPERATION

[75] Inventor: Norio Tomisawa, Hamamatsu, Japan

[73] Assignee: Nippon Gakki Seizo Kabushiki Kaisha, Hamamatsu, Japan

[21] Appl. No.: 76,319

[22] Filed: Sep. 17, 1979

Related U.S. Patent Documents

Reissue of:

[64] Patent No.: 4,148,017
Issued: Apr. 3, 1979
Appl. No.: 712,815
Filed: Aug. 9, 1976

[30] Foreign Application Priority Data

Aug. 15, 1975 [JP] Japan ..... 50-99151
Aug. 15, 1975 [JP] Japan ..... 50-99152
Aug. 20, 1975 [JP] Japan ..... 50-100877

[51] Int. Cl.[4] ..... G10H 1/00; G08C 9/00

[52] U.S. Cl. ..... 84/1.01; 340/365 S; 340/365 C; 340/825.79

[58] Field of Search ..... 340/365 R, 365 E, 365 S, 340/365 C, 166 R; 84/1.01, 1.03, 1.24

[56] References Cited

U.S. PATENT DOCUMENTS 3,626,406 12/1971 Iritani ..... 340/365 S
3,660,838 5/1972 Gove et al. ..... 340/365 C
3,949,365 4/1976 Kashio ..... 340/365 S
3,955,460 5/1976 Southard ..... 340/365 S
3,974,478 8/1976 Griffith et al. ..... 340/365 S
3,981,217 9/1976 Oya ..... 84/1.01
4,041,826 8/1977 Oya ..... 84/1.01
4,051,471 9/1977 Hatano et al. ..... 340/365 R

*Primary Examiner*—Forester W. Isen
*Attorney, Agent, or Firm*—Spensley, Horn, Jubas & Lubitz

[57] ABSTRACT

A device for detecting a key switch operation capable of detecting an operating state of a plurality of key switches which are commonly connected with respect to each row line (block line) at one terminal thereof and commonly connected with respect to each column line at the other terminal thereof, thereby constituting a switch matrix. If a signal is provided on all column lines, the signal is transmitted to a block line through a key switch which is in operation and thereby a block including the key switch in operation is detected. A signal is then supplied from the detected block line to a column line only through the key switch in operation in the detected block. The position of the key switch in operation is known by detecting the columnn line on which the signal arrives. According to an embodiment of the invention, capacitance elements are provided both on the block lines and on the column lines for effecting delivery of the signal by charging and discharging of these capacitance elements. There is also disclosed a construction in which detected blocks are once stored in a memory and positions of key switches in operation in the detected blocks are detected and stored block by block. The stored blocks and key switch positions are codified to produce key codes identifying the key switches in operation.

12 Claims, 14 Drawing Figures

KEYBOARD RANGE

| KEY-BOARD \ OCTAVE | 0 | 1 | 2 | 3 | 4 | 5 |
|---|---|---|---|---|---|---|
| UK | C | C* --- BC ($U_1$) | C* --- C ($U_2$) | C* --- C ($U_3$) | C* --- C ($U_4$) | C* --- BC ($U_5$) |
| LK | C | C* --- C ($L_1$) | C* --- C ($L_2$) | C* --- C ($L_3$) | C* --- C ($L_4$) | C* --- C ($L_5$) |
| PK | C | C* --- BC ($P_1$) | C* --- C ($P_2$) | | | |

DEVICE FOR DETECTING A KEY SWITCH OPERATION

Matter enclosed in heavy brackets [ ] appears in the original patent but forms no part of this reissue specification; matter printed in italics indicates the additions made by reissue.

BACKGROUND OF THE INVENTION

This invention relates to a key switch operation detection device capable of efficiently detecting operations of a number of key switches.

Various proposals have been made for detecting an operating state(making or breaking) of one or more key switches provided in a device such as a keyboard of an electronic musical instrument which has a large number of key switches.

There is a conventional device in which conductors are individually connected to respective key switches and outputs delivered on these conductors are individually detected. This device requires a complicated wiring and therefore is uneconomical. Besides, this device requires a large number of connection terminals for connecting such wiring to a circuit utilizing the result of detection of the key switch states so that it is unsuited for a circuit design employing a semiconductor integrated circuit in which the number of connection pins available for use is limited.

There is another proposal according to which key switches are arranged in a matrix circuit so that each of these key switches will be identified by a column line (input line) and a row line (output line) on which the key switch is disposed and an operating state of each key switch is detected by sequentially scanning all of the key switches. Such proposal is disclosed in the issued U.S. Pat. No. 3,882,751. The proposed device is advantageous in that the number of conductors to be connected between the outside circuit and the key switches can be saved. This device, however, has a problem that an undesirable time delay sometimes occurs between the actual making or breaking of the key switches and detection thereof because all of the key switches must be scanned one by one. Further, time required for detecting the states of all of the key switches is fixed depending upon the scanning speed so that if there are only a few key switches in operation among a large number of key switches, a substantial waste of time occurs due to the fixed time for detection. To reduce such waste of time, the rate of the clock used in the system must be increased with resulting adverse effects on the system such as increase in the power consumption.

With a view to improving the disadvantages in the above described proposal, the applicant has proposed novel key switch detection systems in its issued U.S. Pat. No. 3,899,951 and copending application Ser. No. 602631 now U.S. Pat. No. 4,033,221. These systems basically depend upon scanning of a key switch matrix circuit to detect the operating or nonoperating state of the key switches and the improvement resides in providing a device for reducing the scanning time by scanning only necessary sections from among all the key switches. Such improvement has succeeded only in reduction of the scanning time, but yet the unavoidable waste of time inherent in the scanning systems has remained unsettled. Even if the scanning section is limited only to necessary section(s) in the above scanning systems, the probability that the switches in a nonoperating state are included in the scanning section(s) is fairly high. Accordingly, such nonoperating key switches must be equally scanned and waste of time still occurs.

Furthermore, if a low rate clock is desirable in a circuit utilizing the result of detection of the key switches for reasons of simplification of the circuit design, reduction of power consumption and reduction of manufacturing costs, the above described waste of time accompanying the scanning system must be eliminated. The prior art scanning system apparently has limitations in eliminating such waste of time.

SUMMARY OF THE INVENTION

It is, therefore, an object of the invention to reduce time required for detecting the operation of the key switches to a maximum possible extent.

According to the present invention, each of a number of key switches is connected at one terminal thereof (e.g. a terminal on a movable contact side) to a first detection circuit and at the other terminal thereof (e.g. a terminal on a stationary contact side) to a second detection circuit. In one detection operation mode, signals are applied from the first detection circuit to the second detection circuit in parallel through the key switches to enable the second detection circuit to perform a necessary detection operation. In another detection operation mode, signals are applied from the second detection circuit to the first detection circuit in parallel through the key switches to enable the first detection circuit to perform a necessary detection operation. The operating or nonoperating state of the key switches is detected in accordance with results of the detection operation in the first and second detection circuits.

The detection operation includes storage of signals and the signals are passed through key switches in operation and stored in the first or the second detection circuit. Checking of the respective key switches is made simultaneously in parallel and only signals having passed through the key switches inoperation are stored in the first or the second detection circuit. If the object of detection is making of a key switch "the key switch in operation" means a key switch which is ON and if the object of detection is breaking of a key switch, "the key switch in operation" means a key switch is OFF.

Describing the basic concept of the present invention more specifically, a number of key switches are divided into blocks and block codes (block identifying codes) are assigned to the respective blocks for identifying each block, whereas note codes (note identifying codes) are assigned to the respective key switches in each block for identifying each key switch. A common note code is assigned to key switches of the same note regardless of blocks to which the key switches belong. The key switches can be individually identified by key codes which are combinations of the block codes and the note codes. The key switches of the same note are commonly connected at one terminal thereof to constitute respective note lines which in turn are connected to a note detection circuit (i.e. the first detection circuit) while the key switches of the same block are commonly connected at the other terminal thereof to constitute respective block lines which are connected to a block detection circuit (i.e. the second detection circuit).

DESCRIPTION OF PREFERRED EMBODIMENTS

Figure 1:
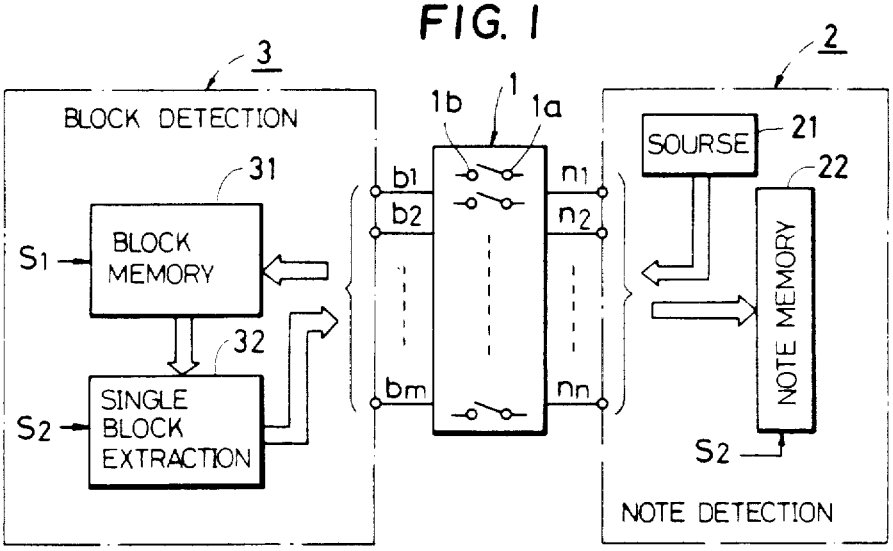
FIGS. 1 and 2 are block diagrams schematically showing the basic construction of the device according to the invention.

As shown in FIG. 1, conductors $n_l$–$n_n$ (note lines) representing respective notes are connected to terminals 1a (movable contacts) disposed on one side of each key switch in a key switch group 1, whereas conductors $b_l$–$b_m$ (block lines) representing respective blocks are connected to terminals 1b (stationary contacts) disposed on the other side of each key switch in the key switch group 1. The conductors $n_l$–$n_n$ are connected to a note detection circuit 2 and the conductors $b_l$–$b_m$ to a block detection circuit 3. Accordingly, thwe total number of the conductors connected to the key switch group 1 is much less than the total number of the key switches. If the total number of the key switches in the present embodiment is represented by $n \times m$, the total number of the conductors required is only $n+m$.

Detection of all of the key switches is completed by implementation of several different detection operation modes (hereinafter briefly to as "operation mode" or "mode").

In the first one of these modes, a signal is supplied from a signal source 21 of the note detection circuit 2 to all the key switches in parallel via the conductors $n_l$–$n_n$. The signal is passed only through the closed contact of the key switch or key switches in operation to a corresponding one of the conductors $b_l$–$b_m$. The detected signal (i.e. from which conductor(s) the signal(s) are delivered) is stored in a block memory 31 of the block detection circuit 3. By this arrangement, the block or blocks in which the key switch or switches in operation exist are detected. The timing of the storing of the detected key switches is in synchronization with a first mode signal $S_1$ designating the first mode.

In the second mode, a single block among the block or blocks stored in the memory 31 is extracted by a single block extraction unit 32 and thereupon a signal is applied through one of the conductors $b_l$–$b_m$ corresponding to the extracted block to the stationary contacts of the respective key switches of the extracted block. The signal from the block detection circuit 3 is passed to one or more of the conductors $n_l$–$n_n$ connected to the movable contacts of the respective key switches for notes covered by the extracted block and corresponding to the key switches in operation. This detected signal (i.e. from which conductor(s) the signal(s) and delivered) is stored in a note memory 22 of the note detection circuit 2. Accordingly, which one or ones of the key switches in the extracted block are in operation is detected. The extracting operation in the single block extraction unit 32 and the storing operation in the note memory 22 are performed in synchronization with a second mode signal $S_2$ designating the second mode.

In the second mode, key switches which are in operation can be individually identified by combination of a single block name extracted by the single block extraction unit 32 and one or more note names stored in the note memory 22.

It will be understood from the foregoing that one feature of the present invention is the construction in which the key switches 1 are connected between the note scanning circuit 2 and the block detection circuit 3 and detection of the key switches 1 in operation is made by transmitting signals in opposite directions through the key switches 1. According to the invention, the terminals 1a and 1b of the key switches 1 are not fixedly used as either input terminals or output terminals but the input side and output side of both terminals are reversed depending upon the operation mode, i.e. whether the operation mode is the first mode or the second mode.

If a circuit (not shown) utilizing the result of detection of the key switches permits, the output of the single block extraction unit 32 and the parallel outputs of the respective notes from the note memory 22 may be directly supplied to the circuit for providing the circuit with the result of key switch detection. If there are blocks which still remain stored in the block memory 31 without being extracted by the single block extraction unit 32, the above described second mode is repeated. More specifically, upon extraction of a certain block stored in the block memory 31 and completion of the second mode for that block, another block stored in the block memory 31 is extracted in response to a next second mode signal $S_2$ and the second mode is repeated. In this manner, the blocks to which the key switches in operation belong and which have been detected and stored in the memory 31 in the first mode are extracted one by one in response to the second mode signal $S_2$. Thus, detection of all the key switches in operation is completed when the second mode is completed with respect to all of the Blocks stored in the memory 31.

Assuming, for example, that a pulse width of the mode signals $S_1$ and $S_2$ respectively is 1 clock time, detection of all of the key switches in operation is completed in only 2 clock times if the key switches in operation belong to a single block. Even if the key switches are in operation in all of the blocks, detection of all of the key switches is completed in "$m+1$" clock times (e.g. 13 clock times if $m=12$). In the prior key scanning systems, time reqired for detection of all of the key switches is 144 clock times in a case where n = 12 and n = 12.

For convenient in the circuit utilizing the result of detection of the key switches, the stored notes in the note memory 22 should preferably be delivered out one by one in series.

According to the invention, for achieving the above objective, a third mode is provided for delivering out the note identifying signals of the key switches in operation from the note memory 22 one by one after the note identifying signals have been stored in the memory 22.

Figure 2:
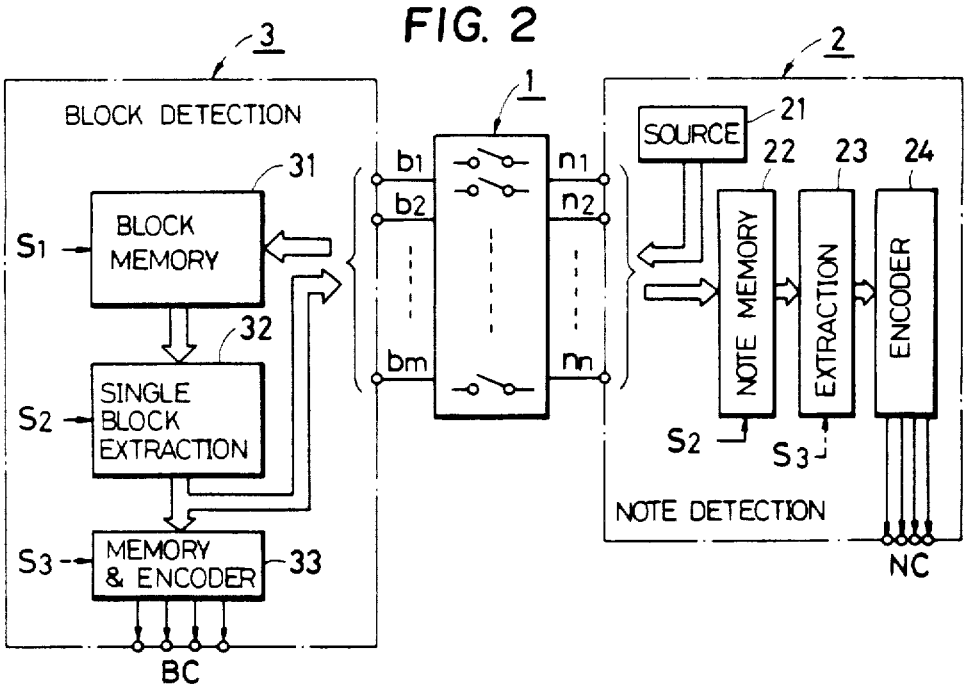

In the third mode, a single one among the notes (i.e. note identifying signals) stored in the note memory 122 is extracted by a stored note extraction unit 23 as shown in FIG. 2 (in which like component parts are designated by the same reference characters) and a signal representing the extracted note is applied to an encoder 24 to produce a code signal (note code NC) consisting of plural bits and representing the note. The extracting operation in the extraction unit 23 is performed in synchronization with a third mode signal $S_3$. This third mode is repeated in response to the clock of the system unitl the note signals stored in the note memory 22 have all been extracted by the note extraction unit 23 and corresponding note code signals have all be delivered out. Since the third mode is implemented only with respect to the notes in the note memory 22, there is no room for occurrence of waste of time. If, for example, three kinds of notes are stored in the note memory 22, the third mode concerning a certain block is completed in 3 clock times. Completion of the third mode can be known by exhaustion of the contents stored in the note memory 22 due to extraction and, upon detection of the completion of the third mode, the mode is returned to the second mode, the single block extraction unit 32 extracting a next stored block and the note memory 22 memorizing the notes of the key switches in operation in that block. Then, the third mode is implemented again. In the third mode concerning a certain block, the signal representing the block is stored in a memory-and-encoder circuit 33 of the block detection circuit 3 whereby a code signal (block code BC) consisting of plural bits and representing the block is produced by the circuit 33. Accordingly, the key switches in operation are detected by combinations of the block codes BC and the note codes NC which are generated in synchronization with each other. The codes of the key switches in operation are produced one by one in series.

As described above, the operation mode changes from the first mode to the second mode, third mode (or repetition thereof), second mode, third mode ..... When production of the key codes has been completed with respect to all of the blocks stored first in the block memory 31 (i.e. when the third mode has been completed), the contents of storage in the block memory 31, have all been extracted and the operation mode now enters a fourth or stand-by mode. After detection of the stand-by mode, the operation mode returns to the first mode and the above described detection operation is repeated. By repetition of the first to the fourth modes, detection of all of the key switches in operation is carried out from time to time.

According to the invention, not only key switches which are turned ON, but also those which are turned OFF may be detected by a construction similar to the above described one. Such construction may be achieved, for example by inverting polarity of signals which are applied to or delivered from the detection circuit 2 and 3 through the key switch group 1, or by employing break contact type switches as the key switches.

One example of the device embodying the invention will now be described with reference to FIGS. 3 through 9.

Figure 3:
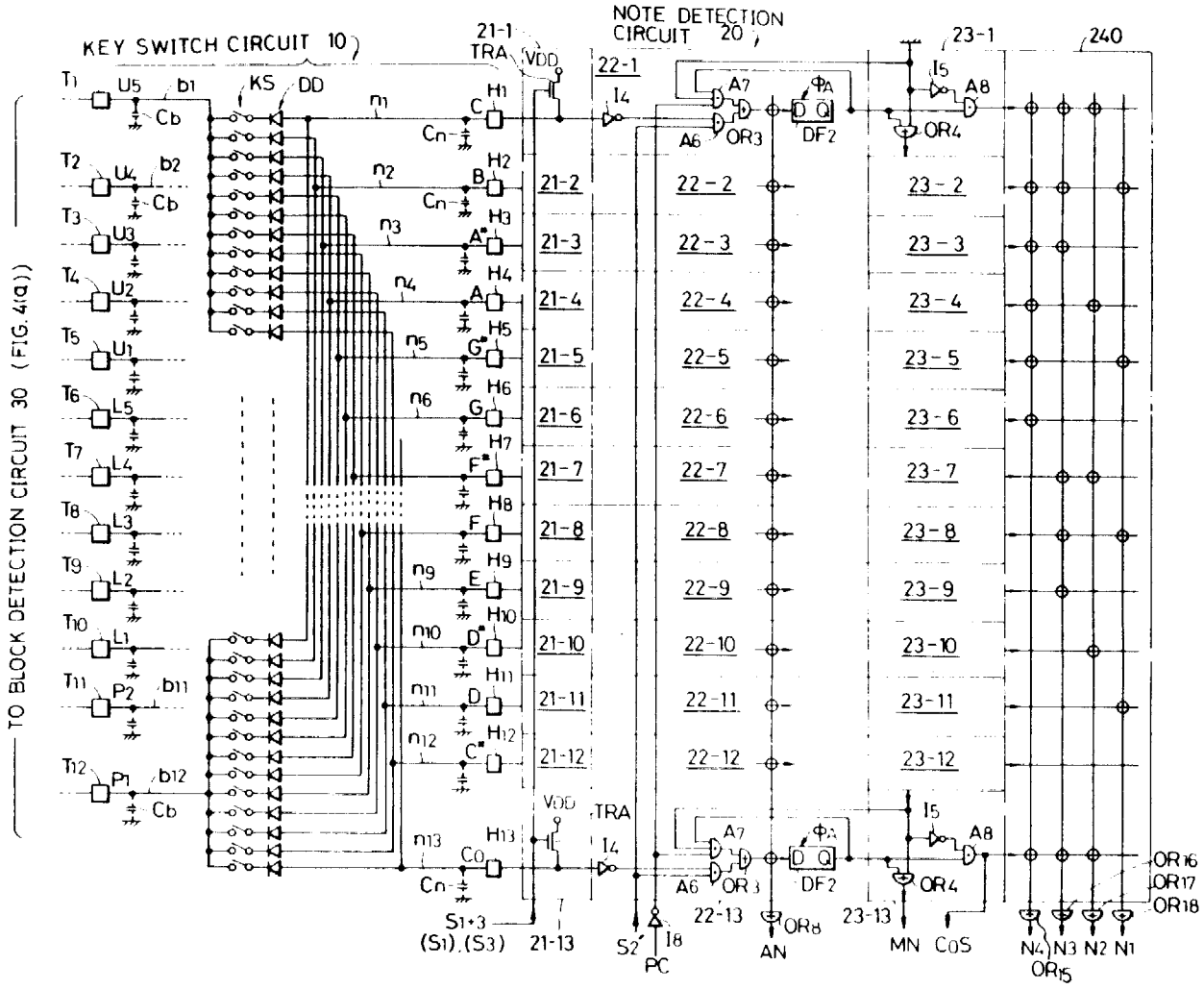
FIG. 3 is a block diagram showing an embodiment of the invention in connection with a key switch circuit and a note detection circuit.

FIG. 3 shows an example of a key switch circuit 10 and a note detection circuit 20. FIG. 4 shows an example of a block detection circuit 30 connected to the key switch circuit 10 shown in FIG. 3.

A number of key switches KS corresponding to the respective keys on the keyboard of the electronic musical instrument are provided in the key switch circuit 10. These key switches are commonly connected block by block with respect to the blocks $U_1$–$U_5$, $L_1$–$L_5$ and $P_1$, $P_2$ at one input terminal thereof (stationary contact) and connected to block input-output terminal $T_1$ through $T_{12}$ vis conductors (block lines) $b_1$–$b_{12}$. The key switches are connected at the other terminal thereof (movable contact) to dodes DD and commonly connected by each note of C#, D, .... A#, B and C. Each of the commonly connected key switch groups is connected to corresponding one of note input-output terminals $H_1$–$H_{12}$ via connectors (note lines)$n_1$–$n_{12}$.

In the present embodiment, the key switches are divided by blocks according to octave ranges of the keyboard so that the notes in each block literally express the actual note names of the keys. Let us assume that as shown in FIG. 5, twelve keys of C#~C are assigned to one octave range from the lowest note side and that the upper keyboard UK comprises 61 keys of a note C of 0th octave through a note C of the fifth octave, the lower keyboard LK comprises 61 keys in the same manner and the pedal keyboard PK comprises 25 keys of a note C of the 0th octave through a note C of the second octave.

Accordingly, the blocks $U_1$–$U_5$ are assigned to the octave ranges of the upper keyboard UK, the blocks $L_1$–$L_5$ to the octave ranges of the lower keyboard LK and the blocks $P_1$, $P_2$ to the octave ranges of the pedal keyboard PK, respectively. Consequently, the notes C#–C in each of the blocks correspond to the note names in the respective octave ranges. In FIG. 3, connections of the key switches are shown in detail with respect only to the block $U_5$(i.e. key switches for the fifth octave of the upper keyboard UK) and the block $P_1$(i.e. key switches for the 0th and the first octave of the pedal keyboard PK). The key switches of the other blocks $U_4$–$P_2$ are likewise connected to the respective conductors $n_1$–$n_{12}$ for the respective notes C, B,A'90 ....., C# and also to conductors $b_2$–$b_{11}$ corresponding to these blocks. As will be apparent from FIG. 5, since the 0th octave includes only one note of C, the note C of the 0th octave (designated here as Co) is incorporated in the blocks $U_1$, $L_1$ and $P_1$ for the first octave. Accordingly, a key switch of the note Co is additionally included in each of the blocks $U_1$, $L_1$ and $P_1$. The key switches of the note Co are commonly connected and further connected to a note input-output terminal $H_{13}$ through a condcutor $n_{13}$ so that the note Co can be distinguished from the note C.

Since the keyboard portion (the key switch circuit 10) is spaced away from the electric circuit portion 2:. 30), relatively long wiring is required for the conductors $n_1$–$n_{13}$ and $b_1$–$b_{12}$ connecting the key switch circuit 10 to the note detection circuit 20 and the block detection circuit 30, and conductor capacitances $C_b$, $C_n$ are observed. For convenience of explanation, conductor capacitance on the block side conductors $b_1$-$b_{12}$ is all designated by the same reference character $C_b$ and conductor capacitance on the note side conductors $n_1$-$n_{13}$ is all designated by reference characters $C_n$. It should be noted, however, that conductor capacitance observed on one of the conductors $b_1$-$b_{12}$ and $n_1$-$n_{13}$ is different from one observed on another. The present embodiment is so constructed that the conductor capacitances $C_b$ and $C_n$ are positively utilized.

The note detection circuit 20 (FIG. 3) is composed of signal delivery circuits 21-1 through 21-13 corresponding to the signal source 21 (FIGS. 1 and 2) and being provided respectively for the note C, B, ..... # and Co, detected note memory circuits 22-1 through 22-13 corresponding to the note memory 22 (FIGS. 1 and 2) and a note code production circuit 240 corresponding to the encoder 24 (FIG. 2). As to the respective circuits 21-1 through 21-13, 22-1 through 22-13 and 23-1 through 23-13, only the circuits 21-1, 22-1, 23-1, 21-13, 22-13 and 23-13 concerning the notes C and Co are illustrated in detail but the rest of the circuits are all of the same construction as these circuits concerning the notes C and Co.

The signal delivery circuits 21-1 through 21-13 are adapted to apply voltage $V_{DD}$ to the note input-output terminals $H_1$-$H_{13}$ by switching of transistos TRA provided for each of the notes. The output from the note input-output terminals $H_1$-$H_{13}$ are applied to the detected note memory circuits 22-1 through 22-13.

Figure 4A:
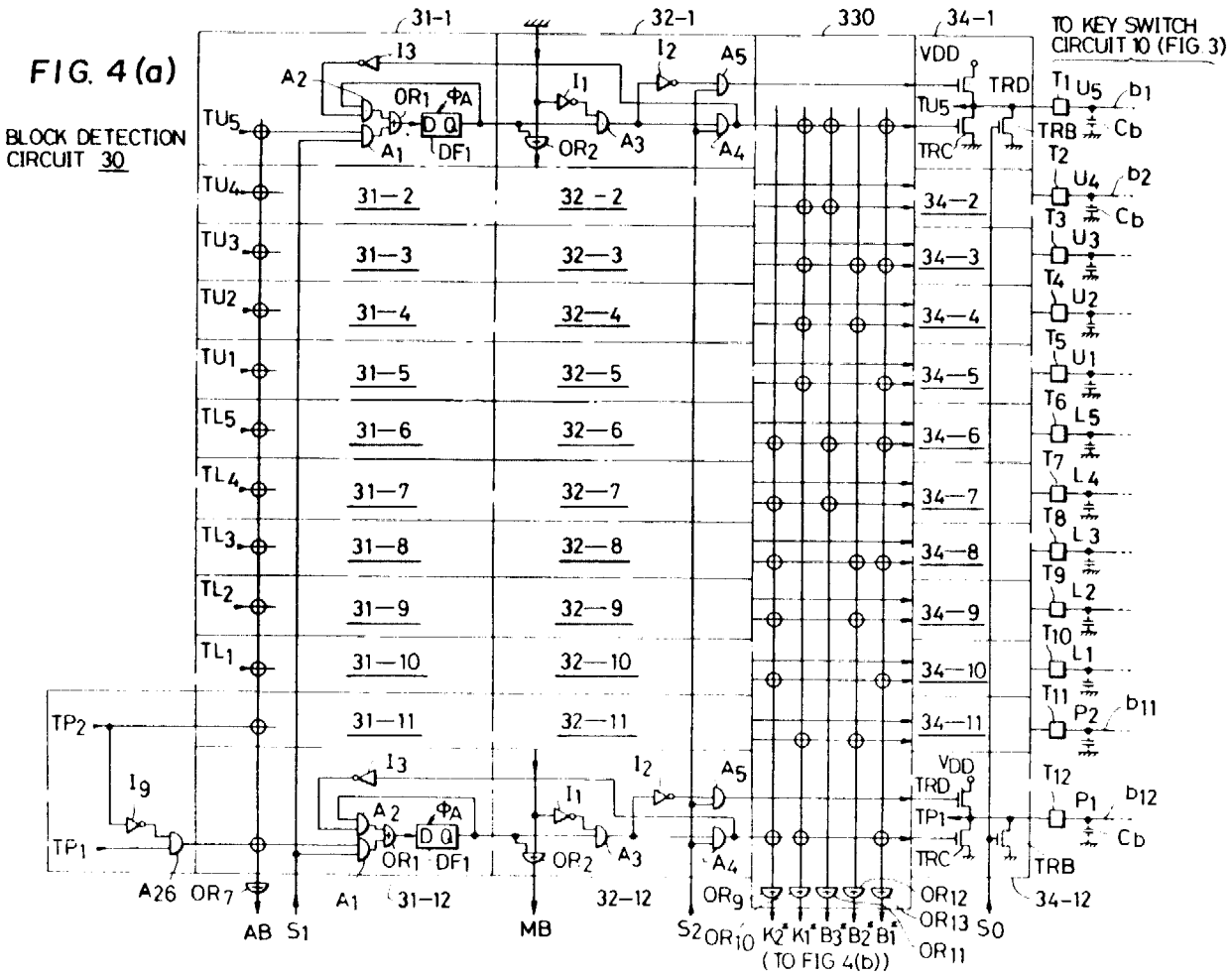
FIGS. 4(a) and 4(b) are block diagrams showing the same embodiment in connection with a block detection circuit.
Figures 4B, 5:
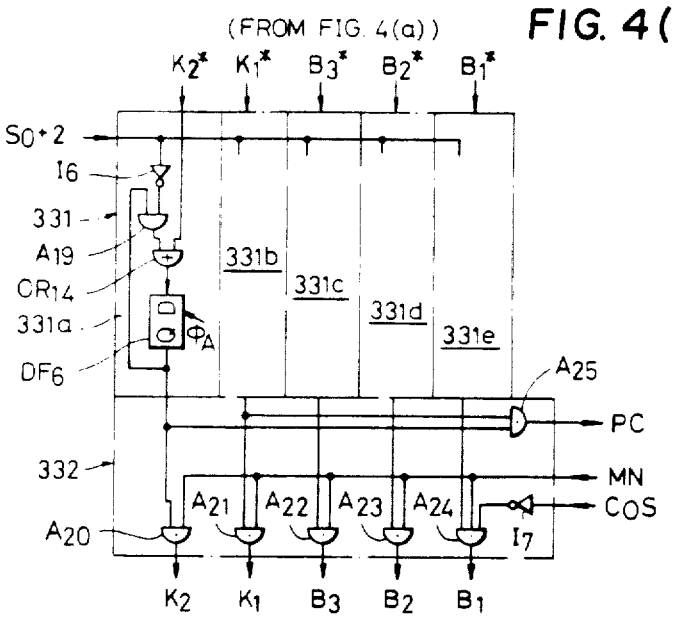
FIG. 5 is a diagram showing how each key switch is identified by a block and a note.
Figure 6:
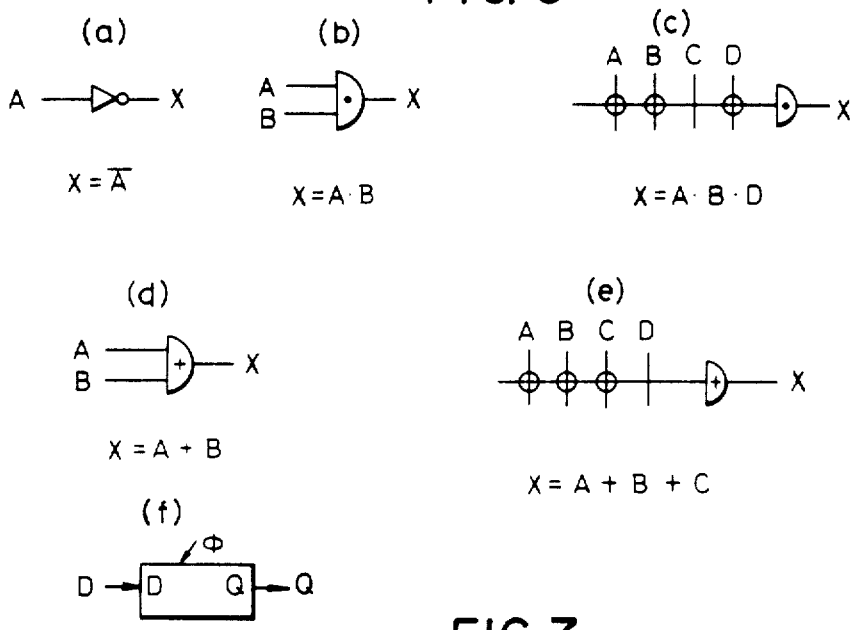
FIG. 6 is a diagram illustrating symbols used for designating logical circuits.

The block detection circuit 30 (FIGS. 4(a), (b)) is composed of detected block memory circuits 31-1 through 31-12 corresponding to the block memory 31(FIGS. 1 and 2) and being provided for the respective blocks $U_5$, $U_4$, ..... $P_2$ and $P_1$, block priority gate circuits 32-1 through 32-12 corresponding to the single block extraction unit 32 (FIGS. 1 and 2), a block code production circuit 330 corresponding to the memory-and-encoder circuit 33 (FIG. 2), a block code temporary memory circuit 331(FIG. 4(b)) for temporarily storing output $B_1^* - K_2^*$ of the block code production circuit 330, a block code output gate circuit 332 (FIG. 4(b)) for delivering out the temporarily stored block codes in synchronization with the outputs of the note code production circuit (240(FIG. 3), and signal delivery circuit 34-1 through 24-12(FIG. 4(a)) for delivering the block signals extracted in a certain priority order by the block priority gate circuits 32-1 through 32-12 to the note detection circuit 20 via the key switch circuit 10.

Only the circuits 31-1, 32-1, 34-1, 31-12, 32-12 and 34-12 concerning the blocks $U_5$ and $P_1$ are illustrated in detail but the circuits 31-2 through 31-11, 32-2 through 32-11 and 34-2 through 34-11 concerning the other blocks are of the same construction as the circuits concerning the blocks $U_5$ and $P_1$. Although the circuits 21-1 through 21-13, 22-1 through 22-13, 23-1 through 23-13, 31-1 through 31-12, 32-1 through 32-12, 34-1 through 34-12 are different from each other, circuit elements (i.e. AND gates, OR gates etc.) of these circuits are designated by the same reference characters irrespective of the kind of block or note so long as such circuit elements perform the same function.

Before describing about operation of the respective circuits, brief explanation will be made about symbols used in the accompanying drawings. Inventers are expressed by the symbol shown in FIG. 6(a), AND gate by the one shown in FIGS. 6(b) and (c), OR gate by the one shown in FIGS. 6(d) and (e) and delay flip-flops by the one shown in FIGS. (f). An AND gate or OR gate with only a few input lines is represented by the symbol shown in FIG. 6(b) or FIG. 6(d) and one with a relatively large number of input lines is represented by the symbol shown in FIG. 6(c) or FIG. 6(e). In the symbol shown in FIG. 6(c) or FIG. 6(e), one input line is drawn on the input side of the AND or OR gate and signal transmission lines are drawn in such a manner that they cross the input line with each crossing point of the input line and the signal transmission line transmitting a signal to the input terminal of the AND or OR gate being marked by a circle. Accordingly, the logical formula of the AND gate shown in FIG. 6(c) is $X = A.B.D$, whereas the logical formula of the OR gate shown in FIG. 6(e) is $X = A + B + C$.

In the embodiment shown in FIGS. 3 and 4, all the key switches in operation are detected by implementation of the first to the fourth operation modes described above. The kind of the operation mode to be implemented is designated by the mode signals $S_0$-$S_3$. The stand-by mode signal $S_0$ designates the fourth mode (stand-by mode), whereas the first through third mode signals $S_1$, $S_2$, and $S_3$ designate the first, second and third modes respectively. The minimum width of the signals $S_0$-$S_3$ in equal to the period of generation of the clock pulse $\phi_A$ so that the whole instrument operates in synchronism with the clock pulse $\phi_A$.

The period of the clock pulse $\phi_A$ can be determined as desired and set at 24 $\mu$s in the present embodiment. Besides this clock pulse $\phi_A$, a low frequency clock LC is used for determining a repetition rate of the key switch detection operation. The period of this clock LC can be determined as desired and should conveniently be 200 $\mu$s-1 ms for detection of the key switches.

Figure 7:
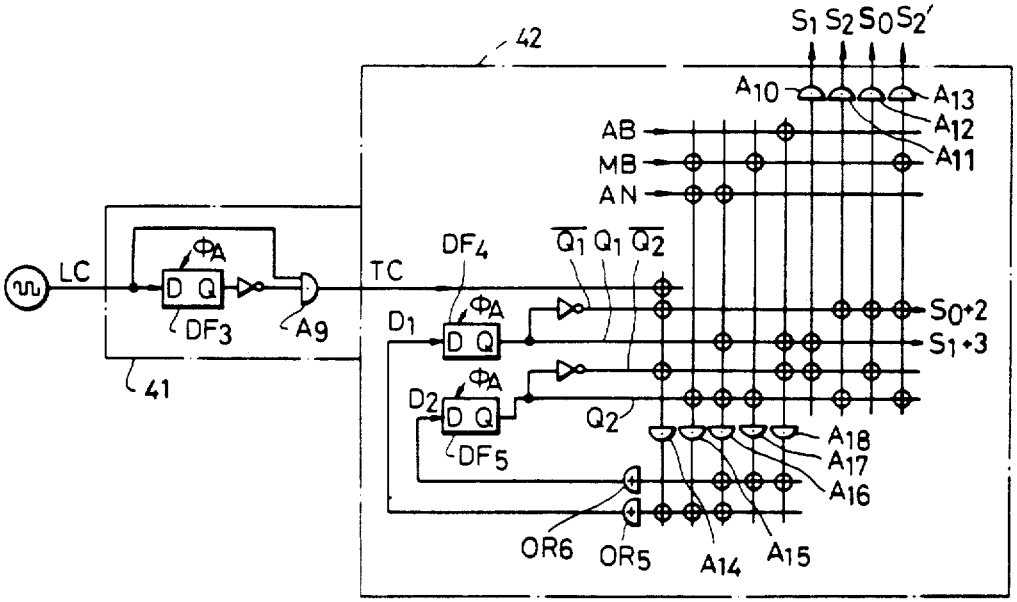
FIG. 7 is a block diagram showing an example of a device for generating mode signals designating various detection operation modes.

FIG. 7 shows one example of a circuit for generating the mode signals $S_0$-$S_3$. In a clock edge detection circuit 41, the low frequency clock LC(of a desired duty factor) is applied to a delay flip-flop $DF_3$ for delaying it by one clock ($\phi_A$) and also to an AND gate $A_9$ whereby the pulse rise of the low frequency clock LC is detected in synchronization with the clock pulse $\phi_A$. By this arrangement, a starting pulse (differentiation pulse)TC having a pulse width equivalent to the period of the clock pulse $\phi_A$ is produced with a period of the clock L.C. Relationship between the clock pulse $\phi_A$ and the starting pulse TC is as shown in FIGS. 8(a) and 8(b). In a mode control circuit 42 in FIG. 7, the stand-by mode signal $S_0$ is produced by an AND gate $A_{12}$ when inverted output signals $Q_1$, $Q_2$ of delay flip-flops $DF_4$, $DF_5$ are both a signal "1". If the starting pulse TC is generated during presence of this stand-by mode signal $S_0$, i.e. during the stand-by mode, the output of an AND gate $A_{14}$ becomes a signal "1". The signal "1" is applied to the delay flip-flop $DF_4$ via an OR gate $OR_5$ and, consequently, the output $Q_1$ becomes a signal "1" one clock ($\phi_A$) later. Since the signal $\overline{Q}_2$ is still signal "1", an AND gate $A_{10}$ is enabled to produce the first mode signal $S_1$. Switching from the stand-by mode to the first mode is thus controlled by the starting pulse TC.

The operation of the embodiment shown in FIGS. 3 and 4 will now be described with reference also to FIGS. 7 and 8.

Figure 8:
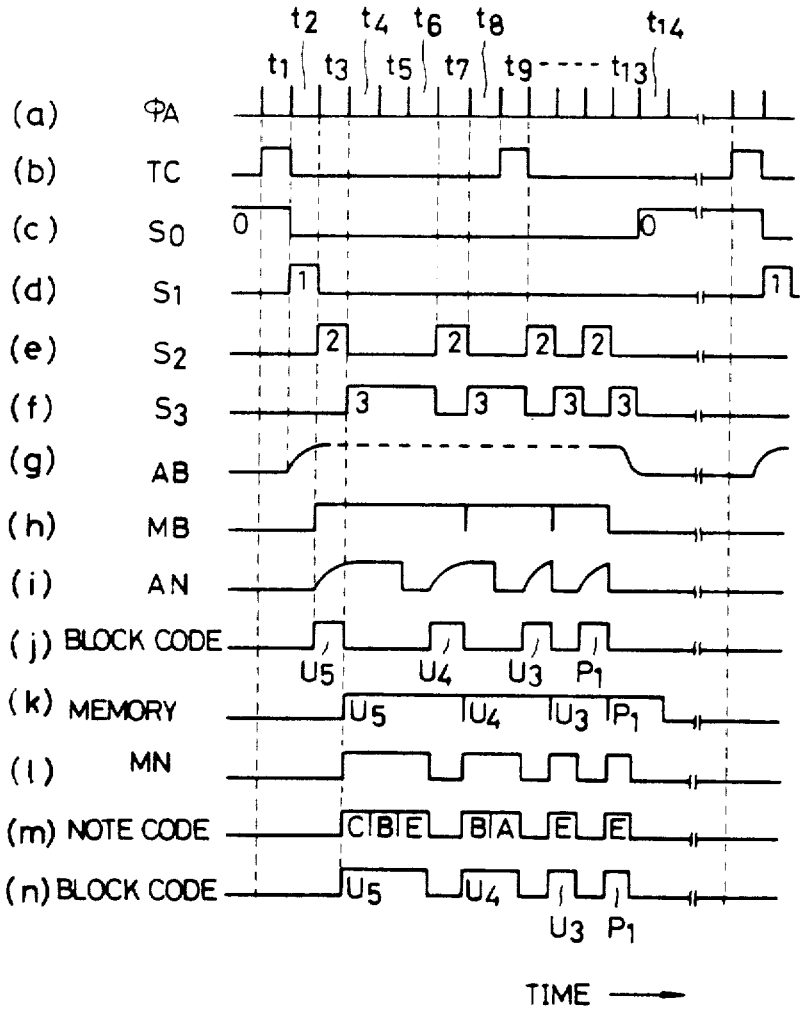
FIGS. 8(a) through 8(n) are timing charts for explaining operations of the component parts shown in FIGS. 3 and 4.

In the stand-by mode shown by period $t_1$ in FIG. 8, the stand-by mode signal $S_0$(FIG. 8(c)) is applied to the signal delivery circuits 34-1 through 34-12 of the block detection circuit (FIG. 4(a)) and thereby brings the transistors TRB of the circuits 34-1 through 34-12 into conduction. As a result, wiring capacitance $C_b$ of the block conductors $b_1$-$b_{12}$is discharged.

As the first mode signal $S_1$ is produced at the period $t_2$(FIG. 8(d)), the signal $S_1$ is applied to the signal delivery circuits 21-1 through 21-13 of the note detection circuit 20(FIG. 3) to bring the transistors TRA into conduction. This causes voltage $V_{DD}$ to be applied to the key switch circuit 10 via the terminals $H_1$-$H_{13}$ to charge the wiring capacitance $C_n$ of the note conductors $n_1$-$n_{13}$. The voltage signal (i.e. the charge voltage of the capacitance $C_n$) is simultaneously delivered to the conductors of one or more of the blocks ($U_5$-$P_1$) to which the key switch or switches KS in operation belong via such key switches and fed from the corresponding terminals ($T_1$-$T_{12}$) to the block detection circuit 30 (FIG. 4(a)). Accordingly, a signal "1" is produced only in the terminal among the terminals $T_1$-$T_{12}$ corresponding to the blocks in which the key switches in operation have been detected.

In FIG. 4(a), outputs $TU_5$-$TP_1$ of the terminals $T_1$-$T_{12}$ are respectively applied to the corresponding ones of the detected block memory circuits 31-1 through 31-12. More specifically, the signals from the terminals $T_1$-$T_{12}$ are applied to AND gates $A_1$ of the circuits 31-1 through 31-12. The first mode signal $S_1$ is also applied to the AND gates $A_1$. Accordingly, a signal "1" is stored in a delay flip-flop $DF_1$ through the AND gate $A_1$ and an OR gate $OR_1$ only in the circuits among the circuits 31-1 through 31-12 corresponding to the blocks in which the key switches in operation have been detected. If, for example, the blocks in which the key switches in operation have been detected are blocks $U_5$, $U_4$, $U_3$ and $P_1$, a signal "1" is stored in the flip-flops $DF_1$ of the circuits 31-1, 31-2, 31-3 and 31-12. The above described first mode is implemented during one clock of the period $t_2$.

If a signal "1" is applied in the first mode to any one of the block memory circuits 31-1 through 31-12 from the block terminals $T_1$-$T_2$, this signal is detected by an OR gate $OR_7$ (FIG. 4(a)) and thereupon an any-block signal AB(FIG. 8(g)) representing existence of a block with respect to which a key switch in operation has been detected. This any-block signal AB is applied to an AND gate $A_{18}$ of the mode control circuit 42 in FIG. 7. Since the first mode signal $S_1$ is present at this time, the signals $Q_1$ and $\overline{Q}_2$ are both "1" and, accordingly, the AND gate $A_{18}$ is enabled and input $D_2$ of the delay flip-flop $DF_5$ becomes "1" through an OR gate $OR_6$. Since input $D_1$ of the flip-flop $DF_4$ at this time is a signal "0", the signal $\overline{Q}_1$ and $\overline{Q}_2$ become both signal "1" at the period $t_3$ (FIG. 8) after lapse of one clock ($\phi_A$). Accordingly, an AND gate $A_{11}$ is enabled to produce the second mode signal $S_2$. The delay flip-flops $DF_1$ of the detected block memory circuits 31-1 through 31-12 (FIG. 4(a)) at this time contain the signal "1" and, accordingly, a signal "1" is fed from the delay flip-flops $DF_1$ storing the signal "1" to OR circuits O $R_2$ of the corresponding block priority gate circuits among the circuits 32-1 through 32-12. The outputs of the OR gate $OR_2$ of each of the circuits 32-1 through 32-11 is connected to the OR gate $OR_2$ of the circuit of an immediately subsequent priority order among the circuits 32-2 through 32-12. Consequently, if there is any one block in which a signal is stored, a signal "1" is delivered out of the OR gate $OR_2$ of the priority gate circuit 32-12 for the block $P_1$ which is of the lowest priority order and this signal constitutes a memory block signal MB(FIG. 8(h)) representing existence of the block storing the signal. This signal MB is applied to AND gates $A_{13}$, $A_{15}$ and $A_{17}$ of the mode control circuit 42 in FIG. 7. Accordingly, the AND gate $A_{13}$ is enabled simultaneously with the generation of the second mode signal $S_2$ and thereupon another second mode signal $S_2'$ is produced.

In the above described manner, the second mode signals $S_2$ and $S_2'$ are generated at the period $t_3$ and the operation mode enters the second mode.

In the second mode in which a single block is extracted from among the stored blocks, the extraction is made in a predetermined priority order in the priority gate circuits 32-1 through 32-12 (FIG. 4(a)). In the embodiment shown in the figure, the priority is given in the order of the blocks $U_5$, $U_4$ . . . $L_5$, $L_4$ . . . $P_2$, $P_1$. In the circuit 32-1 for the block $U_5$ of the highest priority order, the output of an inverter $I_1$ is always a signal "1" so that the AND gate $A_3$ is enabled upon receipt of the signal "1" from the flip-flop $DF_1$ of the circuit 31-1. The outputs of the flip-flops $DF_1$ of the memory circuits 31-1 through 31-11 for the blocks $U_5$-$P_2$ of higher priority orders are applied to the inverters $I_1$ and the OR gates $OR_2$ of the circuits 32-2 through 32-12 for the blocks $U_4$-$P_1$ of the lower priority order. When the signal is stored in the higher order blocks $U_5$-$P_2$, a signal "O" is applied to the AND gates $A_3$ via the inverters $I_1$ of the lower order blocks $U_4$-$P_1$ for inhibiting the AND gates $A_3$. Accordingly, a signal "1" is delivered only from the AND gate $A_3$ of a single one of the priority gate circuits 32-1 through 32-12.

Assuming that key switches in operation have been detected in the blocks $U_5$, $U_4$, $U_3$and $P_1$, a signal "1" is delivered only from the AND gate $A_3$ of the circuit 32-1 for the block $U_5$ at the period $t_3$. The outputs of the AND gates $A_3$ of the circuits 32-2 through 32-12 for the other blocks $U_4$-$P_1$ are all signal "0". The outputs of the AND gates $A_3$ of the respective circuits 32-1 through 32-12 are applied directly to AND gates $A_4$ and also applied to AND gates $A_5$ after being inverted by inverters $I_2$.

The second mode signal $S_2$ is applied to the AND gates $A_4$ and $A_5$ of the priority gate circuits 32-1 through 32-12, whereas the other second mode signals $S_2'$ is applied to the detected note memory circuits 22-1 through 22-13 of the note detection circuit 20 in FIG. 3.

Accordingly, at the period $t_3$, the output of the AND gate $A_4$ of the priority gate circuit 32-1 is a signal "1" and the outputs of the AND gates $A_4$ of the other circuits 32-2 through 32-12 are a signal "0". Thus, the storage of the block $U_5$ only is extracted and the extracted signal is applied to a block code delivery circuit 330 and the transistor TRC of the signal delivery circuit 34-1. The output of the AND gate $A_4$ of the circuit 32-1 is inverted by an inverter $I_3$ of the circuit 31-1 of the same block for inhibiting the AND circuit $A_2$ of the circuit 31-1. The storage in the flip-flop $DF_1$ of the circuit 31-1 therefore is cleared. However, the outputs of the AND gates $A_4$ of the other circuits 32-2 through 32-12 are a signal "0", so that a signal "1" from the inverter $I_3$ is applied to the AND gates $A_2$ of the circuits 31-2 through 31-12 of the same block whereby the output signals of the flip-flops $DF_1$ of the respective circuit 31-2 through 31-12 are self-held. Accordingly storage in the flip-flops $DF_1$ of the blocks $U_4$, $U_3$ and $P_1$ is maintained. The outputs of the AND gates $A_5$ of the other circuits 32-12 through 32-12 become a signal "1" which is applied to transistors TRD of the corresponding signal delivery circuits 34-2 through 34-12.

In the above described manner, the transistor TRC is brought into conduction and the transistor TRD is brought out of conduction in the signal delivery circuit 34-1 for the block $U_5$ while the transistor TRC is brought out of conduction and the transistor TRD is brought into conduction in the signal delivery circuits 34-2 through 34-12 for the blocks $U_4$-$P_1$.

Accordingly, the voltage $V_{DD}$ is applied to the input-output terminals $T_2$- $T_{12}$ of the blocks $U_4$-$P_1$ in the key switch circuit 10(FIG. 3), thereby charging the wiring capacitance $C_b$ of the conductors $b_2$-$b_{12}$. This causes the diodes DD provided for the key switch groups KS for the blocks $U_4$-$P_1$ to be reversely biased with a result that the key switches KS of the blocks $U_4$-$P_1$ are electrically disconnected from the note conductors $n_1$-$n_{13}$. On the other hand, since the potential at the input-output terminal $T_1$ of the block $U_5$drops to the ground potential through the transistor TRC, capacitance $C_b$ of the conductor $b_1$ is discharged and a signal "0" is applied to the key switch KS of the block $U_5$. Thus, the diode DD corresponding to the key switch in operation is brought into conduction through this diode DD. Since the respective key switches of the block $U_5$ correspond to the notes C, B . . . C# and the conductor capacitance $C_n$ of the conductors $n_1$-$n_{12}$ for the respective notes have been charged during the first mode, the conductor capacitance $C_n$ of the note conductors ($n_1$-$n_{12}$) corresponding to the key switches in operation is discharged via the diode DD, the key switches, the terminal $T_1$ and the transistor TRC of the circuit 34-1. If, for instance, three key switches of the notes C, B and E are ON in the block $U_5$, the conductor capacitance $C_n$ of the conductors $n_1$, $n_2$ and $n_9$ for the notes C, B and E is discharged and the capacitance $C_n$ of the other conductors $n_3$-$n_8$, $n_{10}$-$n_{13}$ remains in a charged condition.

Consequently, a signal "0" is supplied from terminals $H_1$, $H_2$ and $H_9$ to the inverters $I_4$ of the detected note memory circuits 22-1, 22-2 and 22-9 whereas a signal "1" is supplied from terminals $H_3$-$H_8$ and $H_{10}$-$H_{13}$ to the detected note memories 22-3 through 22-8 and 22-10 through 22-13. Thus, a signal "0" is delivered from the block input-output terminal $T_1$ of the extracted block $U_5$ to the note input-output terminals corresponding to the key switches in operation through these key switches inoperation, whereby the notes of the key switches in operation are detected.

In the detected note memory circuits 22-1 through 22-13, the signals from the terminals $H_1$-$H_{13}$ are inverted by the inverters $I_4$ and thereafter applied to AND gates $A_6$. The AND gates $A_6$ also receive the second mode signal $S_2'$ so that a signal "1" is stored in the delay flip-flops $DF_2$ via the AND gates $A_6$ and the OR gates $OR_3$ in the memory circuits 22-1, 22-2 and 22-9 corresponding respectively to the notes C, B and E of the detected key switches in operation. In the foregoing manner, the second mode is implemented during the period $t_3$. For causing the circuits 22-1 through 22-13 to store the detected notes, the second mode signal $S_2'$ which is different from the second mode signal $S_2$ is employed so that the detected note will be stored only when a stored block exists (MB=1) and no new storage will be made in the third mode as will be described later.

The second mode finishes in one clock. In the next period $t_4$(FIG.8), a signal "1" is produced in parallel from the flip-flops $DF_2$ of the circuits 22-1, 22-2 and 22-9 storing the detected notes and supplied to the note priority gate circuits 23-1, 23-2 and 23-9. The third mode is implemented during the period $t_4$.

In the third mode in which a single note among the stored notes is extracted, this extraction is effected in accordance with a predetermined priority order in the note priority gate circuits 23-1 through 23-13. In the figure, the priority in extraction is given in the order of the notes C, B, A#. . . C#, Co. As in the note priority gate circuits 23-1 through 23-12, the output of an inverter $I_5$ in the gate circuit 23-1 for the note C of the first priority order is always signal "1", and an AND gate $A_8$ is enabled when a signal "1" is applied thereto from the flip-flop $DF_2$ of the memory circuit 22-1. The outputs of the flip-flops $DF_2$ of the higher notes C-C# are applied to the inverters $I_5$ of the lower notes B-Co through OR gates $OR_4$ and successively inhibit the AND gates $A_8$ of the lower order. The outputs of the flip-flops $DF_2$ of the respective memory circuits 22-1 through 22-13 are applied to AND gates $A_7$ of the circuits 22-1 through 22-13 while the outputs of the flip-flops $DF_2$ of the memory circuits 22-1 through 22-12 of the notes C-C# which are of higher priority orders are successively applied to AND gates $A_7$ of the memory circuits 22-2 through 22-12. The AND gate $A_7$ of the memory circuit 22-1 of the first priority order always receives a signal "O" and, accordingly, the stored contents of the flip-flop $DF_2$ of the circuit 22-1 are not self-held. However, the stored contents of the flip-flops $DF_2$ of the memory circuits 22-2 through 22-12 of the lower priority orders are self-held by the output signal "1" of the flip-flops $DF_2$ of the memory circuits 22-1 through 22-12 of the higher priority orders.

Accordingly, a signal "1" is supplied from the priority gate circuit 23-1 of the note C to a note code delivery circuit 240 at the period $t_4$. At this period, the output s of the other circuits 23-2 through 23-13 are a signal "0". Then at a period $t_5$(FIG. 8), the stored contents of the circuit 22-1 are cleared so that a signal "1" is delivered from the priority gate circuit 23-2 of the note B. At a next period $t_6$ (FIG. 8), the stored contents of the memory circuit 22-2 of the note B are cleared and, accordingly the output signal "1" of the memory circuit 22-9 for the note E storing the signal "1" is applied to the note code delivery circuit 240 via the priority gate circuit 23-9. In this manner, the third mode is successively repeated during clock periods (i.e. three clock periods $t_4$-$t_6$in the above example) corresponding to the number of the stored notes in the memory circuits 22-1 through 22-13.

Since the transistor TRA can be driven by any one of the first mode signal $S_1$ and the third mode signal $S_3$, the transistor TRA in the present embodiment is driven by a first and third mode signal $S_{1+3}$ which can be used both for the first mode and the third mode. Since a prerequisite for entering the third mode is that the operation mode in a preceding one clock is either the second mode or the third mode, arrangements are made so that a signal $Q_2$ is applied to AND gates $A_{15}$, $A_{16}$ and $A_{17}$ in the mode control circuit 42. The fact that this signal $Q_2$ is "1" signifies that the current mode is either the second mode or the third mode. When the signal $Q_2$ and the memory block signal MB from the OR gate $OR_2$ (FIG. 4(a)) are generated and any note signal AN(FIG. 8(i)) is generated upon application to the OR gate $OR_8$ of a signal "1" which has been applied to the flip-flops $DF_2$ of the detected note memory circuits 22-1 through 22-13, the AND gate $A_{15}$ (FIG. 7) is enabled. The any-note signal AN represents that a signal of the detected note is to be stored in any one of the memory circuits 22-1 through 22-13. Since the AND gate $A_{17}$ is enabled whenever the AND gate Ad 15 is enabled, the input signals to the flip-flops $DF_4$ and $DF_{15}$ are both signal "1" and accordingly, the signals $Q_1$ and $Q_1$ become signal "1" one clock later. When the signals $Q_1$ and $Q_2$ are both signal "1", this indicates that the third mode should be implemented (or being implemented). If the any-note signal AN is still produced after entering the third mode, the output of the AND gate $A_{16}$ is a signal "1" and this causes the signals $D_1$, $D_2$ to be "1" thereby instructing that the third mode is to be continued. Since the operation mode is either the first mode or the third mode when the signal $Q_1$ is "1", this signal $Q_1$ is applied to the transistor TRA (FIG. 3) as the first and third mode signal $S_{1+3}$. If the AND gate $A_{17}$(FIG. 7) is enabled and the AND gate $A_{15}$ is not enabled, the second mode signals $S_2$ and $S_2'$ are generated again.

When the notes stored in the detected note memory circuits 22-1 through 22-12 have all been extracted by repetitive implementation of the third mode during the periods $t_4$, $t_5$ and $t_6$, the OR gate $OR_8$(FIG. 3) produces a signal "O" and the any-note signal AN becomes "0". This signifies that the third mode should be finished with respect to the specific block. If there remain any stored blocks (i.e. the signal MB=1), the second mode must be implemented again. Accordingly, the second mode signals $S_2$ and $S_2'$ are produced again in accordance with the output of the AND gate $A_{17}$. In the above described example, signals are still stored in the memory circuits 31-2, 31-3 and 31-12 for the blocks $U_4$, $U_3$ and $P_1$ so that the second mode signals $S_2$ and $S_2'$ are produced at a period $t_7$(FIG. 8).

In the second mode at the period $t_3$, the block code delivery circuit 330 to which a signal "1" has been applied from the priority gate circuit 32-1 (FIG. 4(a)) for the block $U_5$ produces a block code $K_2$*-$B_1$* representing the block $U_5$ and delivers this block code to block code temporary memory circuit 331 shown in FIG. 4(b). In the block code delivery circuit 330, the codes for the respective blocks $U_5$-$P_1$ are formed by combining codes $K_2$, $K_1$ representing the kind of keyboard and codes $B_3$, $B_2$ and $B_1$ representing the kind of octave, as shown in the following Table I.

TABLE I

| | | | key codes | | | | | | | | |
|---|---|---|---|---|---|---|---|---|---|---|---|
| | | | Column A block codes | | | | | Column B note codes | | | |
| | | | K2 | K1 | B3 | B2 | B1 | N4 | N3 | N2 | N1 |
| | key-board | U | 0 | 1 | | | | | | | |
| | | L | 1 | 0 | | | | | | | |
| | | P | 1 | 1 | | | | | | | |
| block | | 0 | | | 0 | 0 | 0 | | | | |
| | | 1 | | | 0 | 0 | 1 | | | | |
| | octave | 2 | | | 0 | 1 | 0 | | | | |
| | | 3 | | | 0 | 1 | 1 | | | | |
| | | 4 | | | 1 | 0 | 0 | | | | |
| | | 5 | | | 1 | 0 | 1 | | | | |
| | | C# | | | | | | 0 | 0 | 0 | 0 |
| | | D | | | | | | 0 | 0 | 0 | 1 |
| | | D# | | | | | | 0 | 0 | 1 | 0 |
| | | E | | | | | | 0 | 1 | 0 | 0 |
| | | F | | | | | | 0 | 1 | 0 | 1 |
| note | | F# | | | | | | 0 | 1 | 1 | 0 |
| | | G | | | | | | 1 | 0 | 0 | 0 |
| | | G# | | | | | | 1 | 0 | 0 | 1 |
| | | A | | | | | | 1 | 0 | 1 | 0 |
| | | A# | | | | | | 1 | 1 | 0 | 0 |
| | | B | | | | | | 1 | 1 | 0 | 1 |
| | | C | | | | | | 1 | 1 | 1 | 0 |

For example, the code for the block $U_5$ *is composed of a code* "O1" representing the upper keyboard U and a code "101" representing the fifth octave. In this code, the bits $K_1$($K_1$*) and $B_1$($B_1$*) are respectively signal "1" and the bits $K_2$($K_2$*) and $B_2$($B_2$*) are signal "0". In the block code delivery circuit 330 an OR gate $OR_9$ produces a signal of the bit $K_2$*, an OR gate $OR_{10}$ the bit $K_1$*, an OR gate $OR_{11}$ the bit $B_3$*, an OR gate $OR_{12}$ the bit $B_2$*, an OR gate $OR_{13}$ the bit $B_1$* respectively. Accordingly, the output signal of the priority gate circuit 32-1 for the block $U_5$ is applied to the OR gates $OR_{10}$, $OR_{11}$ and $OR_{13}$ and the bits $K_1$*, $B_3$* and $B_1$* become a signal "1". Consequently, a code "01101" is produced as the block code $K_2$*, $K_1$*, $B_3$*, $B_2$* and $B_1$* representing the block $U_5$.

In FIG. 4(b), the block code temporary memory circuit 331 has memory circuits 331a–331e for the respective bits $K_2$*-$B_1$* of the block code. In the figure, only the memory circuit 331a for the bit $K_2$* is shown in detail but the other memory circuits 331-b–331e forthe other bits $K_1$*-$B_1$* are of the same construction as the memory circuit 331a. At the period $t_3$, the block code delivered from the block code delivery circuit 330 is applied to the memory circuits 331a–331e, each of the signals representing the bits $K_2$*-$K_2$*-$B_1$* being applied to its corresponding memory circuit. In the memory circuits 331a–331e, the block code is stored in delay flip-flops $DF_6$ via the OR gates $OR_{14}$. The stored signal in the flip-flops $DR_6$ if produced one clock later, i.e. at the period $t_4$ and is applied to a block code output gate circuit 332 and also self-held at the flip-flop $DF_6$ via the OR gate $OR_{14}$. More specifically, since an AND gate $A_{19}$ receives a stand-by mode and second mode signal $S_{0+2}$ through the inverter $I_6$ and this signal $S_{0+2}$ is a signal "0" in the operation modes other than the standby or the second mode, i.e. in the first or the third mode, an inverted signal is "1" during the periods $t_4$, $t_5$ and $t_6$ and, accordingly, the AND gate $A_{19}$ is enabled and the contents of the flip-flops $DF_6$ are self-held. The signal $\overline{Q}_1$ provided by the mode control circuit 42 (FIG. 7) is utilized as the signal $S_{0+2}$ because the signal $\overline{Q}_1$ is "0" in the first or the third mode whereas it is "1" in the second or the stand-by mode.

In the foregoing manner, the block code $K_2$*-$B_1$* delivered from the block code delivery circuit 330 in the second mode at the period $t_3$ as shown in FIG. 8(j) is held in the block code temporary memory circuit 331 as shown in FIG. 8(k) in the third mode ranging over the periods $t_4$-$t_6$. At the period $t_7$ at which the operation mode is back in the second mode, the block code of the block $U_5$ which has been delayed by one clock by the flip-flops $DF_6$ of the memory circuit 331 is delivered by the circuit 331 but this block code is prevented by a block code output gate circuit 332 (FIG. 4(b)).

The outputs of the temporary memory circuit 331a-331e storing the signals of the respective bits of the block code are supplied to AND gates $A_{20}$-$A_{24}$ in the block code output gate circuit 332. The AND gates $A_{20}$-$A_{24}$ receive also a stored-note signal MN supplied from the note detection circuit 20(FIG. 3), so that the AND gates are enabled in synchronization with delivery of a note code. The stored-note signal MN is delivered from the OR gate $OR_4$ of the priority gate circuit 23-13 (FIG. 3) for the note Co of the lowest priority order. In the third mode, the signal MN (FIG. 8(l), is produced every time the signal "1" is supplied from the flip-flops $DF_2$ of the detected note memory circuit 22-1 through 22-13 to a note code delivery circuit 240 via the priority gate circuits 23-1 through 23-13.

The note code delivery circuit 240 in FIG. 3 is provided for generating codes representing note names each of which consists of a plurality of bits $N_4$, $N_3$, $N_2$ and $N_1$. Each note C#, D . . . B, C is codified as shown in the column B of the Table I. In the note code delivery circuit 240, the outputs of OR gates $OR_{15}$, $OR_{16}$, $OR_{17}$ and $OR_{18}$ constitute the signals for the bits $N_4$, $N_3$, $N_2$ and $N_1$. The outputs of the priority gate circuits 23-1 through 23-13 corresponding to the respective notes are applied to the OR gates $OR_{15}$-$OR_{18}$ in accordance with the contents of the column B in Table I. Accordingly, contents of the note code $N_4$, $N_3$, $N_2$, $N_1$ delivered from the circuit 240 in the third mode are "1110" representing the note C at the period $t_4$, "1110" representing note B at the period $t_5$ and "0100" representing the note E at the period $t_6$. These note codes are sequentially delivered out as shown in FIG. 8(m). The stored-note signal MN is also produced in synchronization with the note code as shown in FIG. 8(l).

Accordingly, the AND gates $A_{20}$-$A_{24}$ of the block code output gate circuit 332 (FIG. 4(b)) are enabled only during the third mode (i.e. periods $t_4$-$t_6$) to continuously produce the block code $K_2$, $K_1$, $B_3$, $B_2$, $B_1$ for the block $U_5$ as shown in FIG. 8(n). Simultaneously, the note codes $N_4$, $N_3$, $N_2$, $N_1$ for the notes C, B and E are sequentially produced. The key switches in operation in the key switch circuit 10 can be detected by key codes which are combinations of the block code $K_2$-$B_1$ and the note code $N_4$-$N_1$. Thus, the key codes representing the key switches in operation are utilized in a circuit (not shown) requiring such key codes.

In the above described manner, detection of the key switches in one block is completed by the repetitive implementation of the third mode and only the key codes $K_2$-$N_1$ of the key switches in operation are successively provided in series without wasting time.

The lowest key for the O octave in the column B of Table I is included in the first octave for convenience of actual wiring arrangements of the key switches. The block code portion $B_3$, $B_2$, $B_1$ for the lowest key for the O octave therefore must be provided as "0, 0, 0" a shown in Table I. For this purpose, a signal CoS representing the note C of the Oth octave is applied through an inverter $I_{17}$ to the third input terminal of an AND gate $A_{24}$ corresponding to the bit B in the block code output gate circuit 332 (FIG. 4(b)). The signal CoS is the output of the note Co from the priority gate circuit 23-13 (FIG. 3) and signifies that the note code for the note Co has been produced when the output of the circuit 23-13 is a signal "1". Accordingly, the AND gate $A_{24}$ of the circuit 332 is inhibited by application thereto of the signal CoS and the bit $B_1$ becomes "0". The code of the O octave is thereby produced. When the note Co is not extracted, the output of the inverter $I_7$ is a signal "1" and the AND gate $A_{24}$ is not inhibited.

In case this embodiment is utilized for an electronic musical instrument, the AND $A_{25}$ which receives the outputs of the block code temporary memory circuits 331a, 331b (FIG. 4(b)), i.e. the keyboard codes $K_2$, $K_1$, is utilized for producing a single pedal keyboard tone. The AND gate $A_{25}$ detects the code "11" which is the code $K_2$, $K_1$ of the pedal keyboard P and supplies a pedal keyboard detection signal PC representing that the detected block belongs to the pedal keyboard to the detected note memory circuits 22-1 through 22-13 of the detection circuit 20(FIG. 3). This signal PC is inverted by an inverter $I_8$ and the inverted signal "0" is used for inhibiting the AND gate $A_7$ of the memory circuits 22-1 through 22-13. Accordingly, the flip-flops $DF_2$ of the memory circuits 22-1 through 22-13 do not perform self-holding so that the notes of the key switches in operation of the pedal keyboard block detected in the second mode are stored only for one clock time and only a single note of the first priority order among the stored notes is extracted. Accordingly, the third mode lasts only during one clock time in the case of the pedal keyboard. If the block is for a keyboard other than the pedal keyboard, the signal PC is "0" and the output of the inverter $I_8$ is a signal "1" so that the AND gate $A_7$ is not inhibited. The present embodiment in which the pedal keyboard P is divided into the two blocks $P_1$ and $P_2$ has a function of giving a priority to the block $P_2$ in the production of a single pedal tone. In the block detection circuit 30 in FIG. 4(a), a signal $TP_2$ from the input-output terminal $T_{11}$ is applied to the memory circuit 31-11 of the block $P_2$ and also to an AND gate $A_{26}$ through an inverter $I_9$ for inhibiting the AND gate $A_{26}$. The AND gate $A_{26}$ also receives a signal $TP_1$ from the input-output terminal $T_{12}$ of the block $P_1$ and delivers this signal $TP_1$to the memory circuit 31-12 of the block $P_1$ only when the AND gate $A_{26}$ is not inhibited. By virtue of this arrangement a detection signal is stored only in the memory circuit 31-11 of the block $P_2$ even in a case wherein a key switch in operation has been detected in both the block $P_1$ and the block $P_2$ in the first mode. Consequently, the second mode is not implemented with respect to the block $P_1$.

At the period $t_7$, the second mode signals $S_2$, $S_2'$ are produced again as was previously described. Since the contents of storage in the memory circuit 31-1 (FIG. 4(a)) for the block $U_5$ have already become "0", the stored signal "1" in the memory circuit 31-2 for the block $U_4$ is extracted by the priority gate circuit 32-2 and a signal "1" is provided by the AND gate $A_4$ of the circuit 32-2. Thus, the second mode is implemented with respect to the block $U_4$ at the period $t_7$ in the same manner as at the period $t_3$. At a next clock period $t_8$ (FIG. 8), the third mode is implemented with respect to the detected note of the block $U_4$. Assume, for instance, that the key switches for the notes B and A in the block $U_4$ the key switch for the note E in the block $U_3$ and the key switch for the note E in the block $P_1$ are ON, the respective component parts shown in FIGS. 3 and 7 operate in the same manner as in the above described case of the block $U_5$ to produce the signals shown in FIG. 8. Then the second and the third modes are repeated and detection of all the key switches in operation is completed at a period $t_{13}$. More specifically, the codes $N_4$-$N_1$ for the notes B and A are produced with the code $K_2$-$B_1$ for the block $U_4$ as shown in FIGS. 8(m) and 8(n). Subsequently, the code $N_4$-$N_1$ for the note E is produced with the code $K_2$-$B_1$ for the block $U_3$ and the code $N_4$-$N_1$ for the note E with the code $K_2$-$B_1$ for the block $P_1$. According to FIG. 8, the starting pulse TC is produced by the clock edge detection circuit 41 shown in FIG. 7. Since, however, the operation mode at this time is the third mode, the outputs $Q_1$, $Q_2$ of the flip-flop $DF_4DF_5$ of the mode control circuit 42 are both signal "1" and the signal $\overline{Q}_1$, $\overline{Q}_2$ are both "0" so that the pulse TC is ignored. At the period $t_{13}$, the stored signals in the block memory circuits 31-1 through 31-12 have all been exhausted and the stored block signal MB has therefore become "0". Besides, the stored signals in the note memory circuits 22-1 through 22-13 have all been extracted and the any-note signal AN has become "0". Accordingly, the outputs of the AND gates $A_{14}$–$A_{18}$ of the mode control circuit 42 become "0" and the inputs $D_1$, $D_2$ of the flip-flops $DF_4$ and $DF_5$ become "0". Thus, the signals $\overline{Q}_1$, $\overline{Q}_2$ become "1" at a next clock period $t_{14}$ causing the AND gate $A_{12}$ to produce the stand-by mode signal $S_0$. The operation mode therefore enters the stand-by, i.e. the fourth, mode.

If the starting pulse TC is produced in this stand-by mode, the first mode signal $S_1$ is produced one clock later in the same manner as has been previously been described (simultaneously with the first and third mode signal $S_{1+3}$). Accordingly, the first mode is implemented again and then the second and third modes are repeated. In the foregoing manner, the key codes $K_2$, $K_1$, $B_3$, . . . $N_4$, . . . $N_1$ are successively delivered from the note code delivery circuit 240 of the note detection circuit 20 and the block code output gate circuit 332 of the block detection circuit 30. The period of the low frequency clock LC(or pulse TC) determines starting of a series of detection operation. If the detection operation prolongs exceeding the period of the clock LC, the repetitive operation is conducted by a period which is an integer multiple of the period of the clock LC.

In the above described embodiment, the voltage $V_{DD}$ from the circuits 21-1 through 21-13 of the note detection circuit 20 and the circuits 34-1 through 34-12 of the block detection circuit 30 or ground potential is applied to the conductor capacitances $C_b$, $C_n$ of the key switch circuit 10 only for a short time during which such voltage is required to charge or discharge the conductor capacitances $C_b$, $C_n$. Consequently, in the key switch circuit 10 and other circuits 22-1 through 22-13, power is consumed only transiently and not constantly. This reduction in power consumption is very advantageous in the circuit design. The invention, however, is not limited to the above embodiment but may be applied to a case wherein no conductor capacitances $C_b$, $C_n$ are used. One such example will be described below.

Figure 9:
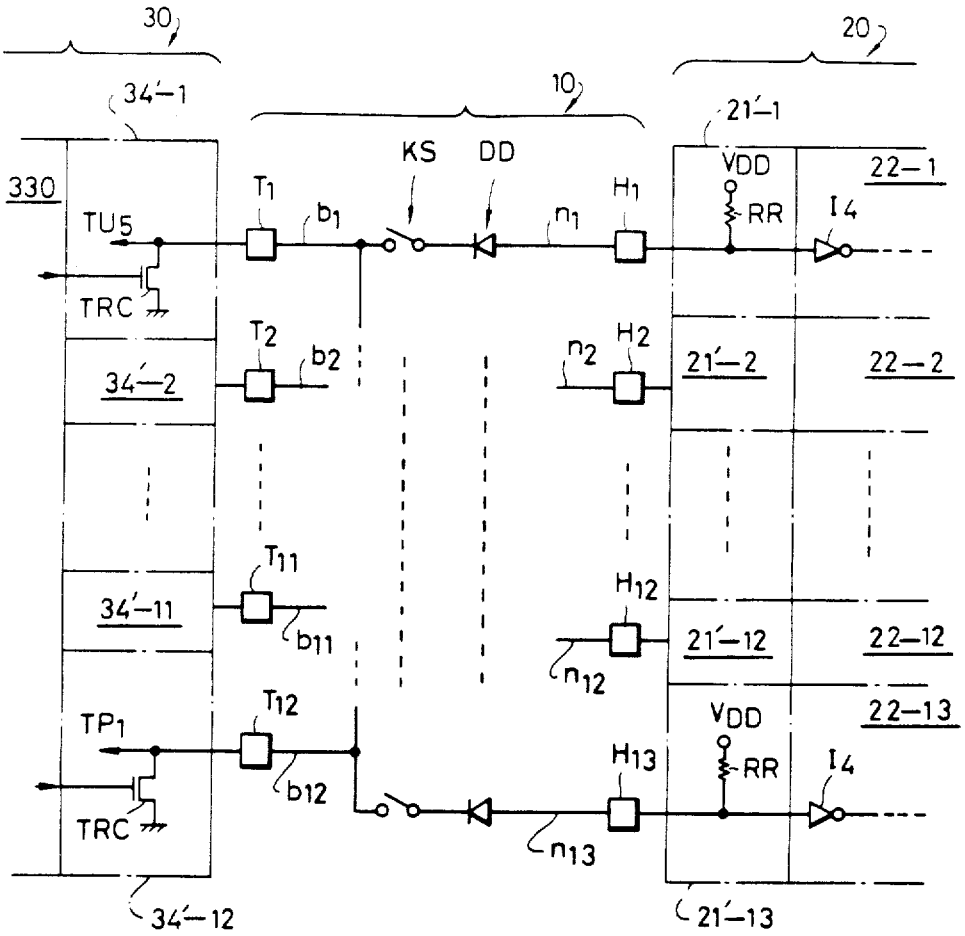
FIG. 9 is a schematic block diagram showing another embodiment of the invention in connection with a key switch circuit.

FIG. 9 shows another embodiment of the invention is connection with the key switch circuit 10. In FIG. 9, illustration of circuits other than signal delivery circuits 21'-1 through 21'-13 of the note detection circuit 20 and circuits 34'-1 through 34'-12 of the block detection circuit 30 is omitted because these omitted circuits are of the same construction as those shown in FIGS. 3 and 4. Referring to the signal delivery circuits 21'-1 through 21'-13 of the note detection circuit 20, the voltage $V_{DD}$ is constantly applied through resistors RR to note input-output terminals $H_1$-$H_{13}$ of the key switch circuit 10 and also to inverters $I_4$ of the detected note memory circuits 22-1 through 22-13. Accordingly, a signal "1" is constantly derived through note terminals $H_1$-$H_{13}$, note conductors $n_1$-$n_{13}$, diodes DD, key switches in operation block conductors $b_1$-$b_{12}$ of the blocks to which the key switches in operation belong and block input-output terminals $T_1$-$T_{12}$, and signals $TU_5$- $TP_1$ (signal "1") of the blocks in which the key switches in operation have been found are supplied to AND gates $A_1$ of the detected block memory switch circuits 31-1 through 31-12 (FIG. 4(a)). As the first mode is implemented upon generation of the first mode signal $S_1$, the detected blocks are stored in the corresponding memory circuits 31-1 through 31-12 (FIG. 4( )). The the operation mode enters the second mode and signals of the blocks extracted by the block priority gate circuits 32-1 through 32-12 (FIG. 4(a)) with a certain order of priority are applied to transistors TRC of corresponding signal delivery circuits 34'-1 through 34'-12 (FIG. 9) thereby enabling these transistors TRC. The circuit between one of the circuits 21'-1 through 21'-13 corresponding to the note of the key switch in operation and the grounded transistor TRC which is now ON conducts through one of the terminals $T_1$-$T_{12}$ for the block in which the transistor TRC is ON, a corresponding one of the block conductors $b_1$-$b_{12}$, the key switch in operation of the block and diode DD, one of the note conductors $n_1$-$n_{13}$ corresponding to the key switch in operation and a corresponding one of the note terminals $H_1$-$H_{13}$. As the circuit conducts, a signal "0" is applied to the inverter $I_4$ of the note memory circuit corresponding to the key switch in operation. The note of the key switch in operation thereby is detected and stored in one of the memory circuits 22-1 through 22-13, and the second mode is implemented. According to this embodiment, a constant power is used so that the transistors TRA and TRB for charging and discharging the conductor capacitances Cb, Cn are not required.

The foregoing description has been made with regard to a case where the present invention is applied to detection of the depressed key on the keyboard of an electronic musical instrument. Accordingly, a circuit utilizing the key code $K_2$-$N_1$ composed of the block code and the note code provided by the note detection circuit 20 and the block detection circuit 30 is one which produces a musical tone signal of a pitch designated by the detected key code and as well as controls its tone color and volume.

It should be noted, however, that the invention can be applied not only to an electronic musical instrument but also to an apparatus such as an input device of a computer in which many switches are employed for efficiently detecting operation of the switches without wasting time.

In the embodiment shown in FIG. 3 and FIG. 4(a), the capacitance $C_n$ on the note side is charged in the first mode and the capacitance $C_n$ corresponding to the key switch in operation is discharged in the second mode. The construction may be modified so that the capacitance $C_n$ is discharged in the first mode. In this case, the signal delivery circuits 21-1 through 21-13 and 34-1 through 34-12 on the note and block sides must be modified to some extent.

Figure 10:
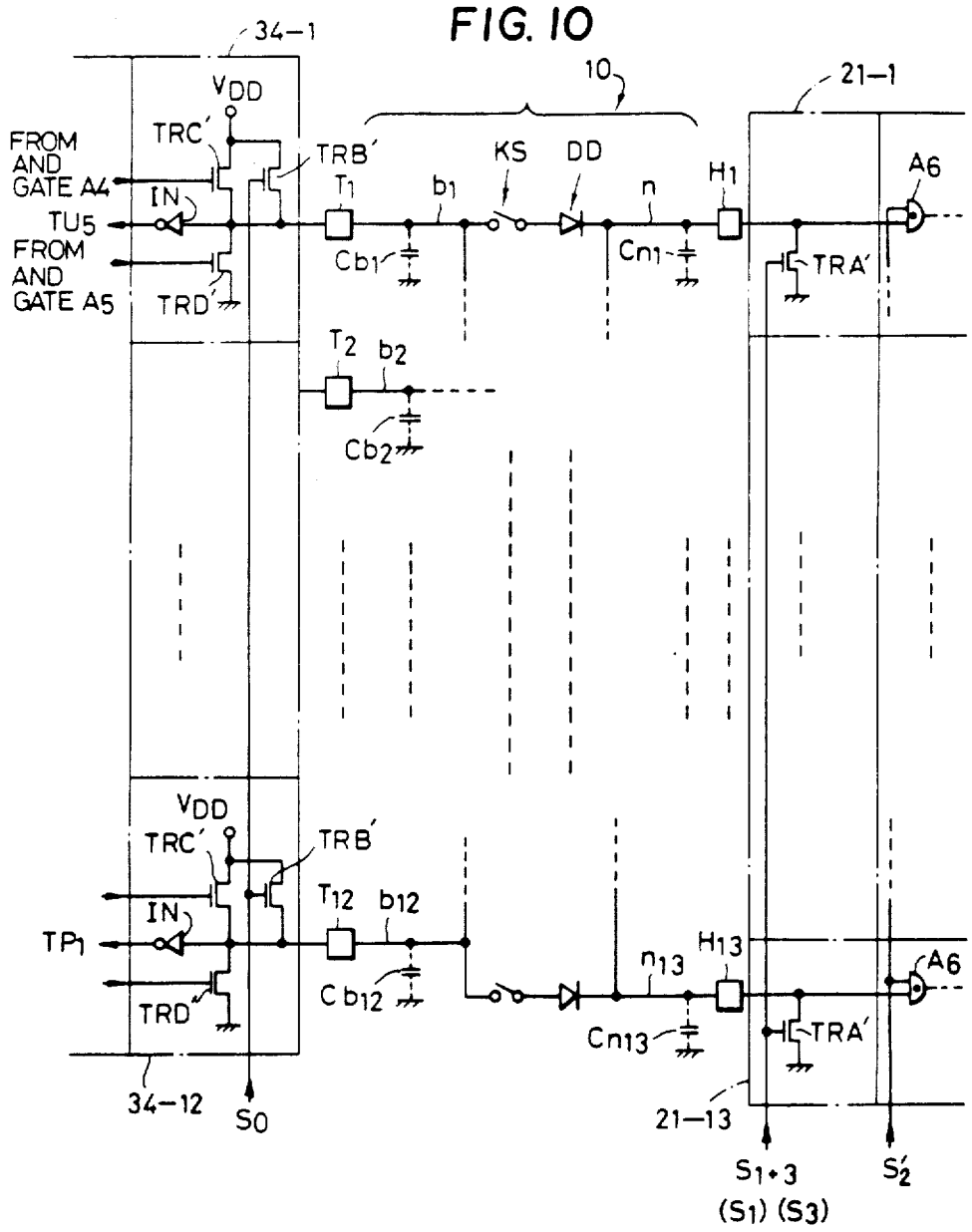
FIG. 10 is a schematic block digram showing still another embodiment of the invention in connection with a key switch circuit.

FIG. 10 shows an example of such modified signal delivery circuits. Transistors TRA' of signal delivery circuits 21-1 through 1-13 on the note side are grounded and a first mode signal $S_1(S_{1+s})$ is applied to these transistors TRA', Transistors TRB' of signal delivery circuits 34-1 through 34-12 on the block side are connected to a power source $V_{DD}$ and a stand-by mode signal So is applied to these transistors TRB'. Diodes DD are connected in a reverse direction to the embodiment shown in FIG. 3.

When the stand-by mode signal So is generated, voltage $V_{DD}$ is applied to block terminals $T_1$-$T_{12}$ through the transistors TRB' thereby charging conductor capacitances $C_{b1}$-$C_{b12}$ on the block side. Then the first mode signal $S_1$ is generated and the transistors TRA' are brought into conduction thereby discharging conductor capacitance $C_n$ on the note side. In response to this discharging conductor capacitance ($Cb_1$-$Cb_{12}$) corresponding to the block including the key switch in operation is discharged. The block including the key switch in operation is detected by this discharging of the conductor capacitance. In the detected block, a signal "0"

is produced from a corresponding one of the terminals $T_1$-$T_{12}$. This signal is reverted to "1" by an inverter IN and thereafter is applied to the detected block memory circuits 31-1 through 31-12.

In the second mode, a transistor TRC' of one of the signal delivery circuit 34-1 through 34-12 corresponding to the single block extracted by the priority gate circuits 32-1 through 34-12 is brought into conduction and a single conductor capacitance (one of $Cb_1$-$Cb_{12}$) corresponding to the specific block is charged. In the signal delivery circuits for the rest of the blocks transistors TRD' are brought into conduction and the rest of the conductor capacitance are all discharged.

Accordingly, a signal is delivered to the note conductors $n_1$-$n_{13}$ through the key switch in operation in the single detected block and one of the conductor capacitances $C_{n1}$-$C_n$—corresponding to the key switch in operation is charged. Thus, the note of the key switch in operation is detected. Since a signal "1" is produced from one of the terminals $H_1$ - $H_{13}$ corresponding to the detected note, the inverter $I_4$ as shown in FIG. 2 is not required in the detected note memory circuits 22-1 through 22-13 but the output from the terminals $H_1$ - $H_{12}$ is directly applied to an AND gate $A_6$.

Even if there is a leakage resistance in the key switch circuit 10, such a leakage resistance in no way affects the operation of the circuit according to the invention. For example, if the leakage resistance is in the order of 1 MΩ, and each of capacitance elements $C_{n1}$-$C_{nn}$ and $Cb_1$-$Cb_m$ is about 1 nF, time constant is 1 nF×1 MΩ=1ms which is sufficiently large against the frequency of the clock $\phi_4$ (about 24 μs in the above example) so that the leakage resistance exercises no adverse effect to the capacitance elements.

The foregoing description has been made with respect to the example in which only key codes of keys in operation are generated. A modified embodiment of the invention in which a start code is produced in the interval of generation of the key code will not be described. The start code is a code which is clearly distinguishable from the key code and used for detecting a key-off state.

Figure 11:
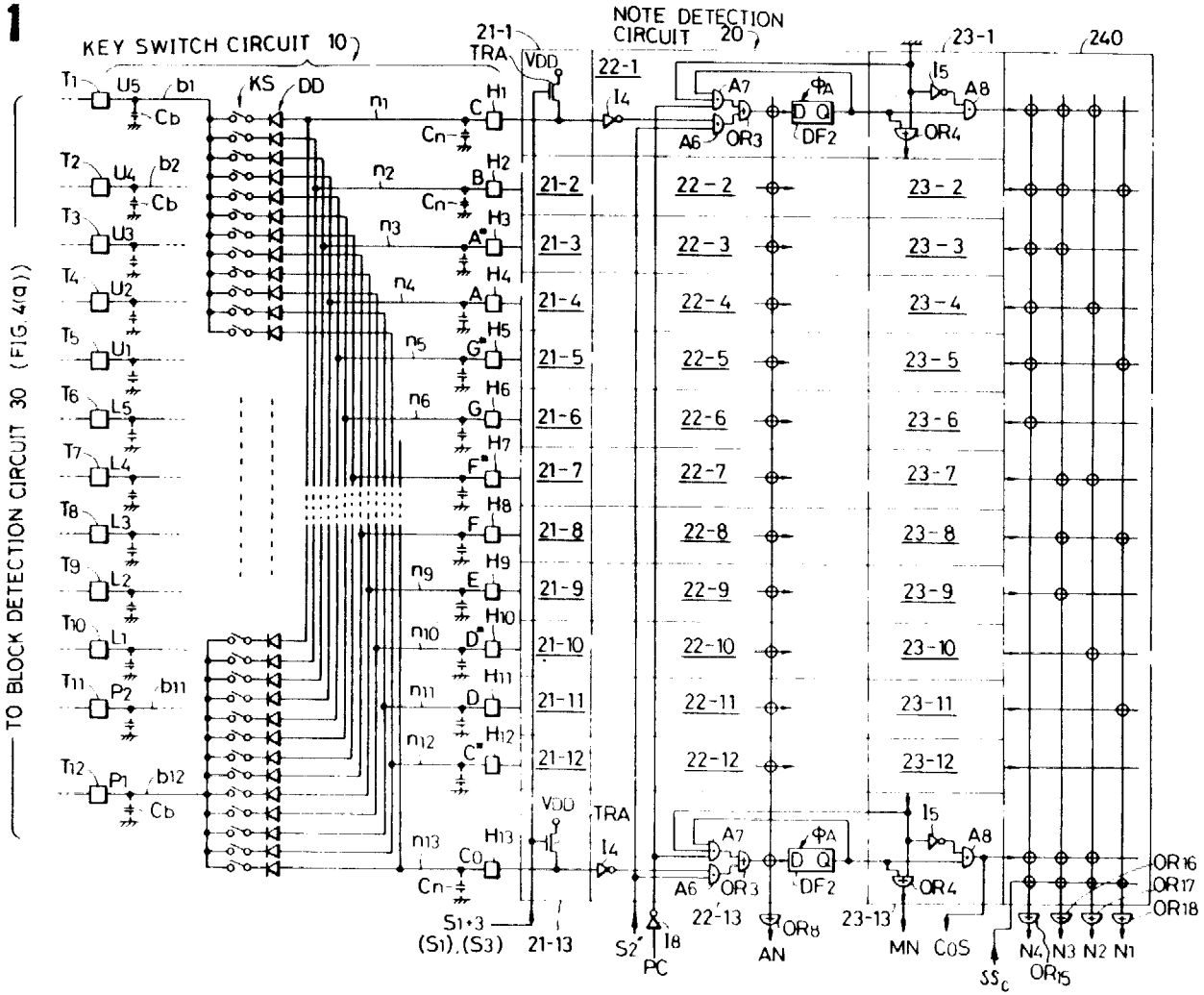
FIG. 11 is a block diagram showing a different example of the note detection circuit producing a start code.
Figure 12:
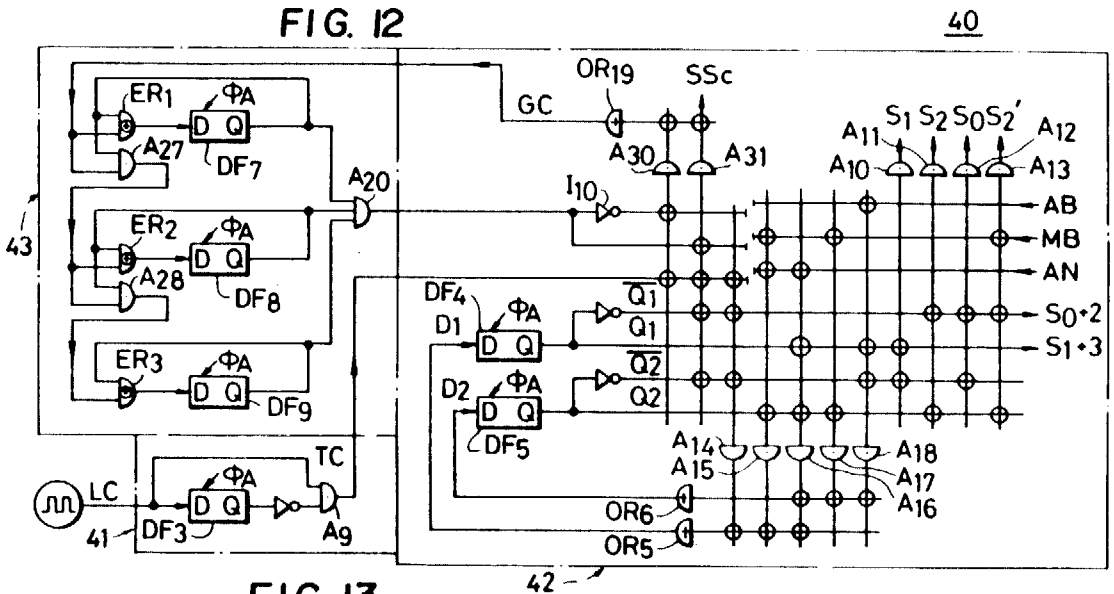
FIG. 12 is a block diagram showing an operation control circuit relating to the modified embodiment.

The present embodiment is different from the previously described by a circuit shown in FIG. 11 and that the mode signal generation circuit shown in FIG. 11 and that the mode signal generation circuit shown in FIG. 7 is substituted by a mode signal generation circuit shown in FIG. 12. The circuit of FIG. 11 is different from the circuit of FIG. 3 in that a signal SSc is applied to OR gates $OR_{15}$ - $OR_{18}$ and is the same as the circuit of FIG. 3 in other respects. Description will therefore be made about the different construction particularly about generation of the start code. The start code SC is produced upon application of a start code designation signal SSc to a note delivery circuit 240 (FIG. 11). The start code designation signal SSc is applied to all of OR gates OR $15_{15}$, $OR_{16}$, $OR_{17}$ and $OR_{18}$ of the note code delivery circuit 240 so that respective bis $N_4$, $N_3$, $N_2$, $N_1$, become "1". Contents of the respective bits $K_2$, $K_1$, $B_3$, $B_2$, $B_1$, $N_4$, $N_3$, $N_2$, $N_1$ of the start code SC are "000001111". The contents of the start code SC are clearly distinguishable from the contents of the key code KC for the detected key switch in operation. The start code designation signal SSc is generated in the stand-by mode as will be described later and, accordingly, the key code KC is never produced concurrently with the start code SC and the bits $K_2$, $K_1$, $B_3$, $B_2$, $B_1$ at this time are all "0". Accordingly, the start code designation signal SSc need not be applied to a block code delivery circuit 330 and the contents of the bis $K_1$-$B_1$ are "00000" without any particular operation.

The start designation signal SSc is generated under control by a control counter 43 of an operation control circuit 40 (FIG. 12) so that the start code SC is produced substantially regularly. The control counter 43 (FIG. 12) is an octanary counter including three delay flip-flops $DF_7$, $DF_8$ and $DF_9$ corresponding respectively to each digit of a binary number of three bits, exclusive OR gates $ER_1$, $ER_2$ and $ER_3$ and AND gates $A_{27}$ and $A_{28}$. Since the conrol counter 43 is an octanary counter, counts used are eight (i.e. 0 through 7 in decimal notation). Whether a specific count is 7 or not is detected by applying the outputs of the flip-flops $DF_7$-$DF_9$ to the AND gate $A_{29}$. Number 7 in decimal notation is "111" in binary notation so that the output "1" of the AND gate $A_{29}$ which is produced when all of the three bits are "1" represents the count 7. When the count is 0 - 6 the output of the AND gate $A_{29}$ is "0".

As the counting pulse for the counter 43, the starting pulse TC is utilized. If the period of the low fequency clock LC applied from outside is approximately 500 μs, the starting pulse TC is also generated with an interval of approximately 500 μs. This interval is about 20 times as long as that of the clock pulse $\phi_4$. The relation between the low frequency clock LC and the starting pulse TC is shown in FIS. 13(a) and 13(b). If the perod of the low frequency clock LC is set at about 1 ms, the period of the starting pulse TC, i.e. the period of the driving pulse for the counter 43, is also about 1 ms.

When the count of the counter 43 is other than 7, the output of the AND gate $A_{29}$ inverted by the inverter $I_{10}$ is a signal "1", and the starting pulse TC is applied to the counter 43 via the AND gate $A_{30}$ and the OR gate $OR_{19}$. The output GC of the OR gate $OR_{19}$ is used as the driving pulse for the counter 43. When the count of the counter 43 is other than 7, the driving pulse GC is generated in synchronization with the starting pulse TC as shown in FIG. 13(d). When the count of the counter 43 is 7, the output signal "1" of the AND gate $A_{29}$ is applied to the AND gate $A_{31}$ while the starting pulse TC is also applied to the AND gate $A_{31}$. The AND gate $A_{31}$ further receives signals $\overline{Q}_1$ and $\overline{Q}_2$. When the signals $\overline{Q}_1$ and $\overline{Q}_2$ are both "1", the operation mode is in the stand-by mode. The output of the AND gate $A_{31}$ is applied not only to the OR gate $OR_{19}$ to produce the driving pulse GC, but also to the note code delivery circuit 240 (FIG. 10) as the start code designation signal SSc. Accordingly, conditions under which the start code designation signal SSc, i.e. the start code SC, is generated are (1) that the count of the counter 43 is 7 and (2) that the starting pulse TC is generated in the stand-by (the fourth) mode.

Figure 13:
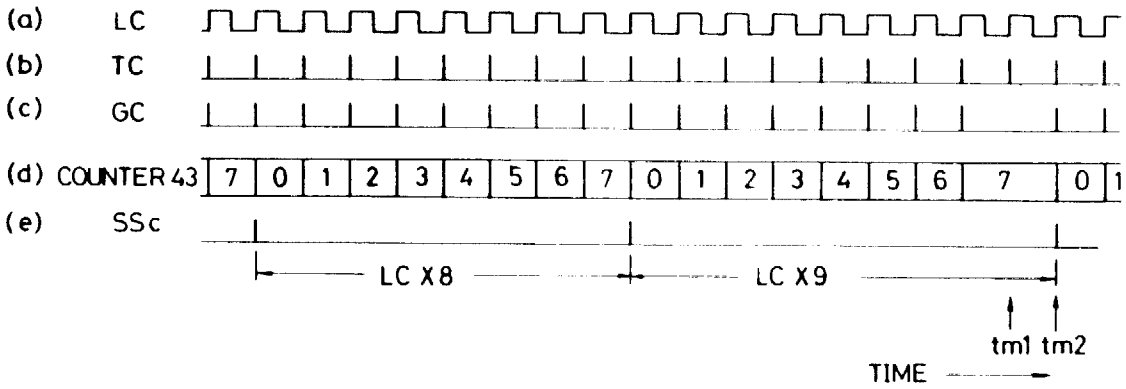
FIGS. 13(a) through 13(e) are timing charts for explaining production of control pulses used in the circuit shown in FIG. 12.

As was previously described, one detection operation of all of the key switches is started by switching from the stand-by mode to the first mode upon generation of the starting pulse TC. Detection of all the key switches in operation is completed before a next shot of the starting pulse TC is generated and, after the operation mode enters the stand-by mode, detection of key switches in operation is started again upon generation of the next starting pulse TC. Accordingly, one detection operation of all the key switches in operation is implemented in the interval of generation of the starting pulse TC(i.e. one period of the low frequency clock LC), and the detection of all the key switches in operation is repeated in accordance with the pulse TC. However, there can be a case where one detection operation has not completed within one period of the pulse TC, if many keys are depressed simultaneously. For example, if the detection operation has not completed at a time point $tm_1$(FIG. 13) when the pulse TC is generated, the key detection mode is in the second or the third mode. As a result, the AND gate $A_{31}$ is not generated. The driving pulse GC is not produced either so that the counter 43 maintains the count 7. If the detection operation has completed by a time point $tm_2$ when a next shot of the starting pulse TC is generated, the start code designation signal SSc is generated as shown in FIG. 13(e) and the driving pulse GC is supplied to the counter 43.

As will be apparent from the above description, the period of generation of the start code designation signal SSc, i.e. the start code SC, is generally determined by the period of the low frequency clock LC and the number of stages of the control counter 43 but exceptionally is longer by one period of the clock LC(or two periods in an extremely rear case). In the case of FIG. 13, the period of generation of the start code designation signal SSc (start code SC) is about eight times that of the period of the clock LC and nine times in an exceptional case. If the period of the clock LC is 500 μs the period of generation of the start code SC is about 4 ms. The employment of the start code is advantageous as the time delay from the start of key operation to the arrival of the start code prevents the chattering state of the key switch from being taken out.

What is claimed is:

1. A device for detecting a key switch operation comprising:

a key switch matrix circuit including a plurality of key switches arranged in rows and columns, said rows representing respective blocks of the key switches;

first means for detecting simultaneously all blocks in which key switches in operation exist;

second means for simultaneously detecting all columns in a single one of said detected blocks on which the key switches in operation are disposed, said column detecting being carried out for one block after another, for each of the separate blocks detected by said first means; and control means for causing said second means to implement the column detection for one block at a time with respect to each of the blocks detected by said first means;

each of said key switches in operation being identified by a combination key code designating the single detected block and the column on which said key switch in operation is disposed.

2. A device for detecting a key switch operation as defined in claim 1 which further comprises:

third means including block memory means for storing signals indicative of the block detected by said first means, and block extraction means for extracting one by one in sequence the detected block-indicative signals stored in said block memory means; and fourth means including note memory means for temporarily storing signals indicating the columns which contain key switches in operation in each block detected by said second means, and column extraction means for extracting the temporarily stored column indicating signals one by one in sequence; whereby the key switches in operation are detected one by one in sequence.

3. A device for detecting a key switch operation as defined in claim 2 which further comprises:

means for producing block code signals representing the blocks extracted by said block extraction means; and means for producing note code signals representing the columns of the key switches in operation extracted by said column extraction means;

whereby key codes identifying the key switches in operation are sequentially produced by said means for producing block and note codes.

4. A device for detecting a key switch operation as defined in claim 3 wherein said first means comprises:

as first signal delivery circuit for supplying signals to said matrix circuit in parallel via conductors corresponding to columns, said supplied signals passing through the respective key switches in operation and leaving the matrix circuit via conductors corresponding to the blocks; and a block detection circuit responsive to the signals supplied by said first signal delivery circuit for simultaneously detecting in a certain period of time all the blocks in which the key switches in operation exist;

wherein said second means comprises:

a second signal delivery circuit for supplying signal to said matrix circuit via the conductor corresponding to a single one of the detected blocks, said signal going through the operated key switches in said single block and leaving the matrix circuit in parallel via the conductors corresponding to rows containing operated key switches in that single block; and a column detection circuit responsive to the signals supplied by said second signal delivery circuit for simultaneously detecting all notes of the key switches in operation in said single block, said fourth means being connected to said column detection circuit;

wherein said third means comprises a circuit for operating said second signal delivery circuit every time one of the blocks is extracted; and wherein said control means comprises a control circuit which performs the control operation in such a manner that whenever said column extraction means has completed extraction of all column indicating signals of one block, said block detection circuit extracts a next block.

5. A device for detecting a key switch operation as defined in claim 1 which further comprises means for producing a finish signal when detection of all of the key switches in operation has been finished.

6. A device for detecting a key switch operation in which key switches in a matrix are connected at row conductor and column conductor terminals thereof to a circuit for detecting the operation of the key switches, comprising:

capacitance elements provided between each matrix row and column conductor and ground;

first charging-discharging means for charging or discharging the capacitance elements provided on the row conductor terminals so that the charge-discharge condition of each such capacitance element indicates whether at least one switch in the corresponding matrix row is in operation;

second charging-discharging means for charging or discharging the capacitance elements provided on the column conductor terminals only through the key switches in operation in one of the matrix rows in which there is at least one switch in operation, as indicated by the charge-discharge condition of said capacitance element on the corresponding row conductor terminal; and detection means responsive to the charge-discharge condition of each capacitance element on the column conductor terminals, as caused by said second charging-discharging means, for detecting which columns in said one matrix row contain key switches in operation.

7. A device for detecting a key switch operation as defined in claim 6 which further comprises:

separate detection means responsive to the charge-discharge condition of the capacitance elements provided on the row conductor terminals caused by said first charging-discharging means;

memory means for storing signals representing the charge-discharge conditions detected by said two detection means separately on the side of the row conductor terminals and on the side of the column conductor terminals; and means for sequentially extracting and codifying only the signals stored in said memory means.

8. A system for detecting actuated key switches in a matrix, comprising:

source means for providing signals in parallel to all columns of said matrix, a block memory having a storage cell associated with each row of said matrix, said block memory storing the signals received from said source means via said matrix so as to indicate which rows contain at least one actuated switch, single block extraction means for reading our row-indicating signals stored in said block memory one at a time, in sequence, and for providing a signal to said matrix along the single row corresponding to the currently read-out row-indicating signal, a note memory having a storage cell associated with each column of said matrix, said note memory storing signals received from said block extraction means through said matrix so as to indicate which columns in said single row contain actuated switches, note extraction means for reading pout column-indicating signals from said note memory one at a time, in sequence, each such read out column-indicating signal and the concurrently read out row-indicating signal together uniquely identifying a corresponding actuated switch in said matrix, and timing control means connected to said block extraction means and to said note extraction means, for causing said single block extraction means to read out the next sequential row-indicating signal only after all of the column-indicating signals for said single row have been read out by said note extraction means.

9. A system for detecting the operation of individual switches in a matrix, comprising:

a matrix of row conductors and column conductors, each switch being connected at an intersection of said matrix, there being a capacitance between each conductor and ground, first means for precharging all of the capacitances of each column conductor, whereby the capacitance of each row conductor which is connected to any column conductor by at least one closed switch will be initially charged second means for subsequently charging all of said row conductor capacitances except one that was previously charged by said first means, said one row capacitances being discharged, whereby all of said column capacitances for column conductors that are connected to said one row conductor by a closed switch will be discharged, all other column capacitances remaining charged, and means, responsive to the resultant charge condition of said row and column capacitances, for uniquely indicating the matrix position of closed switches in said matrix.

10. A system according to claim 9 further comprising:

encoder means for producing encoded signals identifying the specific column conductors having discharged capacitances, and control means, responsive to completion of read-out by said encoder means, for causing said first means again to precharge all of said column conductor capacitances, and for causing said second means to charge all of said row conductor capacitances except another one that was initially charged by said first means, whereby all of said column capacitances for column conductors that are connected to said other row conductor by a closed switch will be discharged, all other column capacitances remaining charged.

*11. A device for detecting a key switch operation comprising:*

*a key switch matrix circuit including a plurality of key switches arranged electrically in rows and columns each connected via a unidirectional element between row conductors and column conductors, said rows representing respective blocks of the key switches;*

*first means for detecting simultaneously all blocks in which key switches in operation exist;* second means for simultaneously detecting all columns in a single one of said detected blocks on which the key switches in operation are disposed, said column detecting being carried out for one block after another, for each of the separate blocks detected by said first means;

*control means for causing said second means to implement the column detection for one block at a time with respect to each of the blocks detected by said first means;*

*first capacitance means provided between each row conductor and ground;* first voltage applying means connected to said first capacitance means to apply thereto a first level voltage which would forward bias said unidirectional elements for a first predetermined period as preparation for the block detection;

*second capacitance means provided between each column conductor and ground;*

*second voltage applying means connected to said column conductors to apply thereto a second level voltage which would forward bias said unidirectional elements for a second predetermined period so that the voltage of such row conductor that is connected to key switches in operation is changed from said first level voltage to said second level voltage, and this change being detected by said first means;*

*said second level voltage being applied also to said second capacitance means for this second predetermined period as preparation for the note detection, said first means being arranged to apply said first level voltage to the row conductors of the detected blocks one at a*

*time for a third predetermined period so that the voltage of such column conductor that is connected to a key switch in operation is changed from said second level voltage to said first level voltage, and this change being detected by said seond means;*

*each of said key switches in operation being identified by a combination key code designating the single detected block and the column on whch said key switch in operation is disposed.*

*12. An electronic musical instrument comprising a key code generator which is composed of means for sequentially scanning with a first clock a plurality of blocks into which a plurality of key switches having contacts to be closed are divided, a priority selector for selectively outputting with a second clock closure information of each block sequentially in accordance with predetermined priority, means for inhibiting the first clock with an operation signal of the priority selector during its operation to temporarily stop the block scanning and means for converting the output from the priority selector and information of the block scanning to key data of a binary code and means for detecting completion of one scanning to output a variable frame signal of one frame time determined by the number of blocks and the number of closed key switches the converting means operating during each time frame.*

* * * * *